United States Patent [19]

Wakabayashi et al.

[11] Patent Number: 5,081,635
[45] Date of Patent: Jan. 14, 1992

[54] APPARATUS FOR CONTROLLING OUTPUT FROM AN EXCIMER LASER DEVICE

[75] Inventors: Osamu Wakabayashi; Noritoshi Ito; Masahiko Kowaka, all of Kanagawa, Japan

[73] Assignee: Kabushiki Kaisha Komatsu Seisakusho, Tokyo, Japan

[21] Appl. No.: 465,184

[22] PCT Filed: Aug. 25, 1988

[86] PCT No.: PCT/JP88/00841
§ 371 Date: Feb. 26, 1990
§ 102(e) Date: Feb. 26, 1990

[87] PCT Pub. No.: WO80/02175
PCT Pub. Date: Mar. 9, 1989

[30] Foreign Application Priority Data

Aug. 25, 1987 [JP] Japan ................. 62-210821
Aug. 28, 1987 [JP] Japan ................. 62-214398

[51] Int. Cl.⁵ ............................. H01S 3/22
[52] U.S. Cl. ........................ 372/57; 372/31;
372/32; 372/33; 372/98; 372/20
[58] Field of Search ............ 372/29, 57, 31–33,
372/98, 270

[56] References Cited

U.S. PATENT DOCUMENTS

| 4,829,536 | 5/1989 | Kajiyama et al. | 372/57 |
| 4,926,428 | 5/1990 | Kajiyama et al. | 372/20 |
| 4,947,398 | 8/1990 | Yasuda et al. | 372/29 |
| 4,977,563 | 12/1990 | Nakatani et al. | 372/32 |
| 4,991,178 | 2/1991 | Wani et al. | 372/32 |

Primary Examiner—Léon Scott, Jr.
Attorney, Agent, or Firm—Diller, Ramik & Wight

[57] ABSTRACT

An apparatus for controlling an output from an excimer laser device wherein at least two etalons each having a large diameter are arranged between a rear mirror and a laser chamber for the excimer laser device is disclosed. With the apparatus, the operative range of laser light outputted from the excimer laser device can be narrowed by executing superposition control for a wavelength of laser light which transmits through each etalon, while maintaining the number of spatial lateral modes. The apparatus is preferably employable as a light source particularly for a unit for projecting and exposing figures in a reduced size. Superposition control with the use of a superposition control unit, excitation intensity control for laser gas with the use of an excitation intensity control unit and partial gas replacement control for laser gas with the use of a gas control unit are executed in a predetermined timing relationship, respectively.

33 Claims, 31 Drawing Sheets

APPARATUS FOR CONTROLLING OUTPUT FROM AN EXCIMER LASER DEVICE

TECHNICAL FIELD

The present invention relates generally to an apparatus for controlling an output from a narrow band excimer laser device. More particularly, the present invention relates to an apparatus for controlling an output from an excimer laser device wherein the apparatus is preferably employable as a light source particularly for an unit for projecting and exposing figures in a reduced size.

BACKGROUND ART

Attention has been paid to an excimer laser device which is usable as a light source for an unit for projecting and exposing figures in a reduced size for the purpose of producing semiconductor devices. This is attributable to many remarkable advantages derived from the facts that it is possible to extend a limit of light exposure to a level of wavelength of excimer laser shorter than 0.5 micron because an excimer laser has a short wavelength (e.g., KrF laser has a wavelength of about 248.4 nm). the excimer laser device has a deep focus depth compared with a g line and an i line emitted from a mercury lamp which has been heretofore used, provided that each device has a same resolution, the number of lens apertures (NA) can be reduced, an exposing range can be widened and large power can be generated by the device.

However, the excimer laser device has two significant problems to be solved when it is used as a light source for an unit for projecting and exposing figures in a reduced size.

One of them is that the excimer laser has a short wavelength of 248.35 nm and only quartz can be used as a starting material for lenses in view of uniformity and machining accuracy due to the fact that material through which it can transmit is limited only to quartz, $CaF_2$ and $MgF_2$. This makes it impossible to design a lens for projecting figures in a reduced size with its color aberration corrected. Therefore, there is a need of narrowing an operative range of the excimer laser device to such an extent that any color aberration can be neglected.

The other problem to be solved is how to prevent a speckle pattern from appearing as the operative range of the excimer laser device is narrowed and how to suppress reduction of power caused as the operative range of the excimer laser device is narrowed.

As an prior technique of narrowing the operative range of the excimer laser device, there is known a so-called injection lock process. This injection lock process is such that a wavelength selection element (etalon, diffraction grating, prism or the like) is disposed in a cavity at an oscillator stage, laser light is oscillated in a single mode while a spatial mode is restricted by a pin hole, and the thus oscillated laser light is synchronously introduced into the excimer laser device via an amplifying stage. This arrangement allows laser light outputted from the excimer laser device to have a high property of coherence. Thus, when the excimer laser device operable in accordance with the injection lock process is used as a light source for an unit for projecting and exposing figures in a reduced size, a speckle pattern is generated. In general, it has been considered that generation of a speckle pattern depends on the number of spatial lateral modes involved in laser light. Further, it has been known that when the spatial lateral modes involved in the laser light has a small number, a speckle pattern is liable to appear and that, to the contrary, when the number of spatial lateral modes increase, the speckle pattern hardly appears. The above-described injection lock process is substantially concerned with a technique for narrowing the operative range of the excimer laser device by largely reducing the number of spatial lateral modes. However, since the injection lock process has a significant problem of generation of a speckle pattern, the excimer laser device can not be employed for an unit for projecting and exposing figures in a reduced size.

In addition, as other promising technique for narrowing the operative range of the excimer laser device, there is known a technique of using etalons each serving as a wavelength selecting element. In this connection, it will be helpful to note that as a prior technique of using etalons in that way, AT & T Bell Research Institute has proposed a technique for narrowing the operative range of the excimer laser device by arranging an etalon between a front mirror and a laser chamber for the excimer laser device. With this technique, however, it has been found that it has a problem that a large quantity of power loss is caused by inserting the etalon between the front mirror and the laser chamber and moreover it has a drawback that the number of spatial lateral modes can not be increased so much.

In view of the aforementioned problem and drawback, the inventors conducted a variety of research and development works and reached a knowledge that excimer laser light can be generated in the narrowed operative range with an output of about 50 mJ per each pulse by arranging etalons each having a large effective diameter (about several decimal millimeters in diameter) between a rear mirror and a laser chamber for the excimer laser device to uniformly narrow the operative range of the excimer laser device of which spectrum width is less than about 0.003 nm in terms of a half value across the full width within the range of 20×10 mmb. Namely, the inventors resolved an essential problem which arose when the excimer laser device was used as a light source for an unit for projecting and exposing figures in a reduced size, by arranging etalons between the rear mirror and the laser chamber for the excimer laser device with the operative range narrowed, the number of spatial lateral modes maintained and the power loss reduced by arrangement of the etalons in that way.

In fact, arrangement of the etalons between the rear mirror and the laser chamber for the excimer laser device provides excellent advantages that the operative range can be narrowed, the number of spatial lateral modes can be maintained and the power loss can be reduced. However, it has been found that such arrangement has problems that physical variation, e.g., variation of a temperature of each etalon or the like occurs due to remarkable increased power of laser light transmitting through the etalons, resulting in variation of center wavelength of oscillated output laser light, oscillation of plural wavelengths and substantially reduced power of laser light. This tendency is notable particularly when two or more etalons each having a different free spectrum range are used to narrow the operative range of an excimer laser device.

As is well known, the excimer laser is gas laser. With the excimer gas, however, it is known that there appears a phenomenon that a performance of laser medium gas for the excimer laser is gradually degraded and laser power is reduced as time elapses. To prevent such phenomenon from appearing, output control is carried out for holding a laser output constant by controlling an intensity of excitation of the laser medium, i.e., discharge voltage. In detail, to hold the laser output constant, the output control is practiced by varying a voltage between electrodes to vary an intensity of excitation of the laser medium or by carrying out partial replacement of gas serving as a laser medium via a gas controller.

The excimer laser device is a laser device from which pulses are oscillated, and energy of each pulse fluctuates to some extent. Accordingly, when variation of laser power is to be monitored, a plurality of pulses are sequentially monitored to evaluate laser power by averaging the sampled pulses.

In a case of superposition control for allowing a wavelength of laser light transmitting through each etalon to coincide to each other, center wavelength power is monitored. Also in a case of excitation intensity control, laser power is monitored. These monitoring operations are performed to evaluate laser power by sampling a plurality of pulses and then averaging the sampled pulses.

In a case where the both superposition control and excitation intensity control are used together, since a superposition control system itself varies laser power and determines that the time point when center wavelength power is maximized coincides to the time point when the superposition control expires, there is a danger that incorrect determination is made such that the superposition wavelength control expires in spite of the fact that center wavelength power is practically maximized by an excitation intensity control system. This is same with the excitation intensity control. Namely, there is a danger that incorrect determination is made such that the excitation intensity control expires in spite of the fact that center wavelength power is practically maximized by the superposition control system.

Thus, when the superposition control and the excitation intensity control are used together, it can not be discriminated whether reduction of laser power is caused due to incorrect superposition of etalons or deterioration of a performance of the laser medium. As a result, there arises a danger that wavelength and laser power can not be controlled with stability.

SUMMARY OF THE DISCLOSURE

The present invention has been made with the foregoing background in mind and its object resides in providing an apparatus for controlling an output from an excimer laser device including two or more etalons each having a different free spectrum range, the etalons being arranged between a rear mirror and a laser chamber for the excimer laser device, wherein a center wavelength of output laser light is immovably held with high accuracy and variation of laser power is minimized to provide stable output.

Other object of the present invention is to provide an apparatus for controlling an output from an excimer laser device adapted to carry out both superposition control and excitation intensity control wherein wavelength and power of excimer laser light can be controlled stably.

According to the present invention, two or more etalons each having a different free spectrum range are arranged between a rear mirror and a laser chamber for the excimer laser device and a property of wavelength selection for each of the etalons is feeback controlled by detecting a center wavelength of output laser light and power of the output laser light having the center wavelength. Thus, according to the present invention, center wavelength and power can be stabilized by simultaneously or alternately executing the following two controls.

1) Center wavelength control—This control is such that a wavelength of laser light transmitting through at least the etalon having a minimum free spectrum range is shifted to control the center wavelength of output laser light to a required wavelength.

2) Superposition control—This control is such that a wavelength of laser light transmitting through the other etalon(s) exclusive the etalon having a minimum free spectrum range is shifted to carry out control in such a manner that wavelengths of laser light transmitting through all the etalons superpose each other so as to provide maximum power.

Here, control for a center wavelength of laser light transmitting through each etalon is accomplished by controlling a temperature of each etalon, an angle of the same, a refractive index of gas in an etalon gap (i.e., representative of pressure of the gas) and a distance across the etalon gap.

In addition, according to the present invention, the above-described objects are accomplished by executing both superposition control and excitation intensity control in a different timing relationship therebetween to eliminate the mutual influence attributable to the superposition control and the excitation intensity control, while taking into account a difference between characteristics of the superposition control and characteristics of the excitation intensity control in this connection with power variation.

For example, in a case where only the superposition control is carried out, variation of laser power is caused in two types, one of them representing variation of laser power essentially inherent to the superposition control and the other one representing variation of laser power due to variation of a performance of the laser medium. Since the latter variation is very slowly caused compared with the former variation, it can be determined that a factor of causing variation of laser power resides in the superposition control, unless the excitation intensity control is carried out.

Therefore, a superposition control unit makes it possible to always look for an optimum superposed state.

To the contrary, in a case where only the excitation intensity control is carried out, it is possible to easily control laser power, unless the superposition control is carried out.

In a case where the superposition control is continuously carried out and the excitation intensity control is periodically carried out, control is practiced such that wavelength and laser power quickly expire at a predetermined value, respectively, by carrying out the aforementioned two controls at the substantially same time under a specific condition that laser power varies largely during partial exchange of the laser medium or the like. This assures that competition or interference does not take place between the both controls and thereby wavelength and laser power can be controlled with stability.

BEST MODE FOR CARRYING OUT THE INVENTION

Now, the present invention will be described in detail hereinafter with reference to the accompanying drawings which illustrate preferred embodiments thereof.

Figure 1:
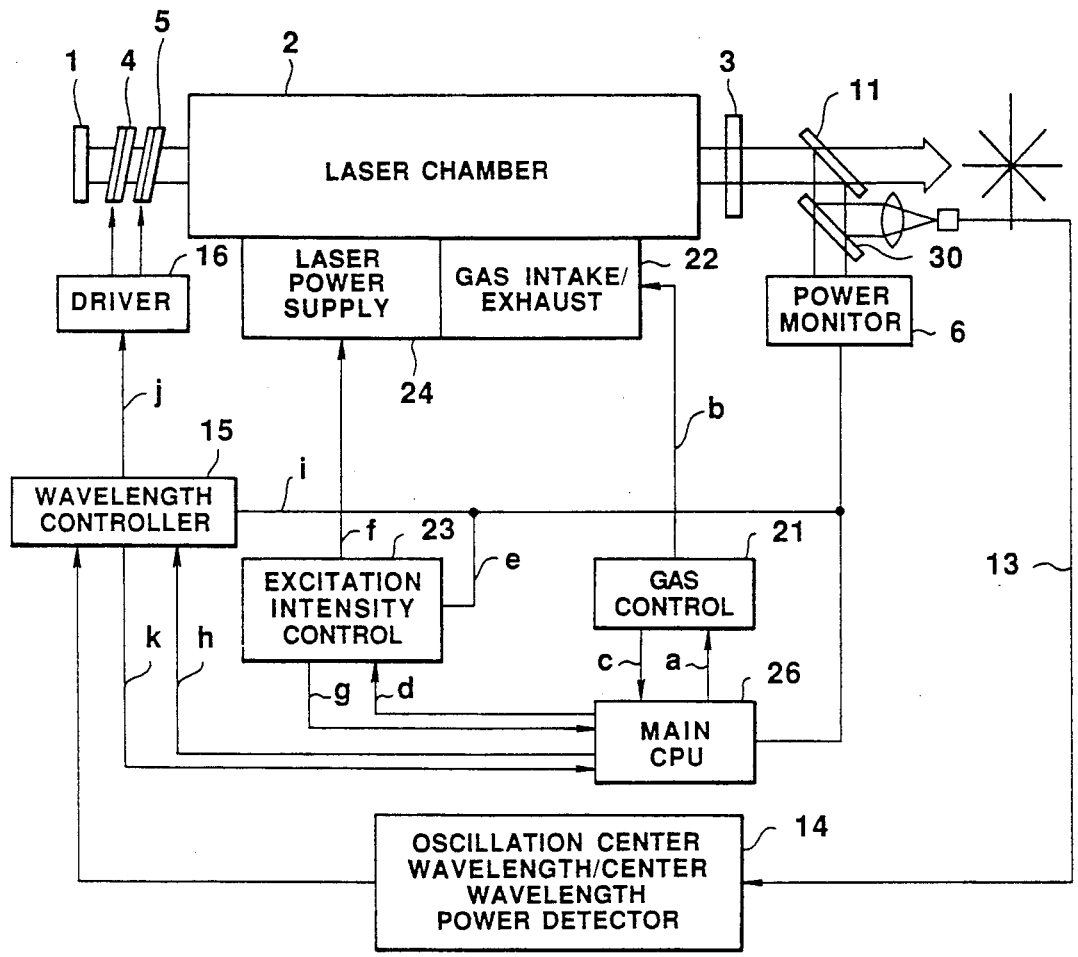
FIG. 1 is a block diagram which schematically illustrates an apparatus for controlling an output from an excimer laser device in accordance with an embodiment of the present invention.

FIG. 1 is a block diagram which schematically illustrates an apparatus for controlling the output from an excimer laser device in accordance with an embodiment of the present invention. The excimer laser device to be controlled is constructed such that it includes a rear mirror 1, an excimer chamber 2 and a front mirror 4 and two etalons 4 and 5 of which free spectrum range is different from each other are arranged between the rear mirror 1 and the laser chamber 2.

A part of laser light outputted from the excimer laser device is taken out as sample light via a beam splitter 11 so that it is monitored by a power monitor 6.

The laser light which has been taken out as sample light via a beam splitter 30 is inputted into an oscillation center wavelength/center wavelength power detector 14 via an optical fiber 13.

Excitation intensity control is executed based on an output from the power monitor 6 and moreover gas control is executed for laser gas.

Superposition control is executed by controlling a property of wavelength selection (a property of selecting a center wavelength of transmitted laser light) of the etalons 4 and 5 by a wavelength controller 15 based on an output from the power monitor 6 or the oscillation center wavelength/center wavelength power detector 14.

The excitation intensity control is executed by controlling a laser power supply source 24 by an excitation intensity control unit 23 based on an output from the power monitor 6 and then controlling a voltage to be applied to an electrode for laser gas excitation which is not shown in the drawing.

Gas control is executed by carrying out partial replacement of laser gas in the laser gas chamber 2 by a gas control unit 21.

The wavelength controller 15, the excitation intensity control unit 23 and the gas control unit 21 are controlled in compliance with a superposition executing command h, an excitation intensity control executing command d and a partial gas replacement executing command a, respectively, each of which is outputted from a main central processing unit (hereinafter referred to as a main CPU) 26 in accordance with a predetermined timing relationship.

When the wavelength controller 15 receives the superposition control executing command h from the main CPU 26, it performs a sampling operation for a pulse output i with the aid of the power monitor 6 or the excitation center wavelength/center wavelength power detector 14 to calculate the current laser output or a center wavelength power and evaluate the superposed state. Thereafter, it sends a superposition adjusting signal j to the etalons 4 and 5 and on completion of the superposition control, it feed a superposition control completion signal k back to the main CPU 26.

When the excitation intensity control unit 23 receives the excitation intensity control executing command d from the main CPU 26, it performs a sampling operation for a pulse output e with the aid of the power monitor 6 to calculate the current laser output and determine whether the laser output correctly coincides with a predetermined value or remains within a certain allowable range. In response to this determination, it sends an excitation intensity adjusting signal f to the laser power supply source 24 to raise or lower a discharge voltage and then feeds an excitation intensity controlling completion signal g back to the main CPU 26.

When the laser power can not be restored to the original state even with an increased excitation intensity, the main CPU 26 sends the partial gas replacement executing command a to the gas control unit 21. If partial gas replacement is to be carried out during laser oscillation, it is required that excitation intensity control and superposition control are frequently executed due to rapid variation of laser power. For the reason, when the main CPU 26 outputs the partial gas replacement command d, it successively sends the excitation intensity control executing command d and the superposition control executing command k twice to enter a partial gas exchange mode.

Figure 2:
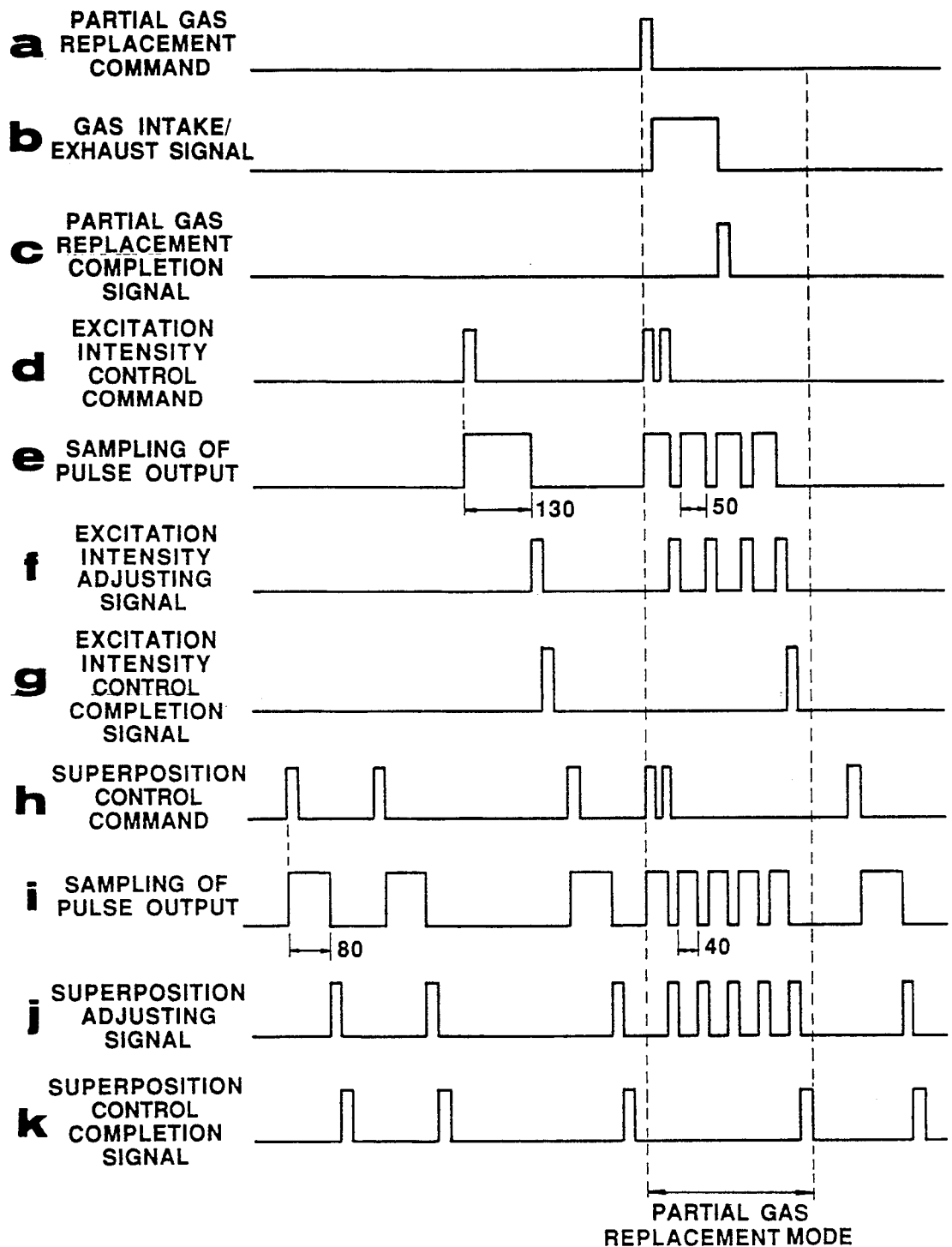
FIG. 2 shows a plurality of time charts which illustrate operations to be performed by the apparatus shown in FIG. 1, respectively.

When partial gas replacement is carried out, variation of the laser power continues for a short period of time after completion of the partial gas replacement. For the reason, both the excitation intensity control and the superposition control are continuously carried out for a predetermined period of time or by a predetermined number of times after completion of the partial gas replacement, while the main CPU 26 is held in the partial gas replacement mode. Thereafter, the partial gas replacement mode is ended. According to the shown embodiment of the present invention, the number of sampling pulses required for the excitation intensity control is set to 130 pulses and the number of sampling pulses required for the superposition control is set to 80 pulses. However, when the main CPU 26 enters the partial gas replacement mode, the number of sampling pulses for the excitation intensity control is set to 50 pulses and the number of sampling pulses for the superposition control is set to 40 pulses. A variety of controlling operations as described above are illustrated in a plurality of time charts in FIG. 2.

In such a manner, according to the embodiment of the present invention, the main CPU 26 separately sends a control executing command to the excitation intensity unit 23 and the wavelength controller 15 and starts a next control on receipt of control completion signals from the respective control units. Thus, with the apparatus of the present invention, a factor for inducing variation of laser power during a controlling operation can easily be recognized, whereby an occurrence of control confusion due to competition or interference between the excitation intensity control and the superposition control can reliably be controlled and moreover rapid variation of the laser power because of entrance in the partial gas replacement mode can adequately be compensated. Accordingly, the apparatus of the present invention makes it possible to stabilize the laser power for a long period of time.

According to the above-described embodiment of the present invention, the number of sampling pulses for the excitation intensity control is set to 130 pulse and the number of sampling pulses for the superposition control is set to 80 pulses. Further, when the main CPU 26 enters a partial gas replacement mode, the number of sampling pulses for the excitation intensity control is set to 50 pulses and the number of sampling pulses is set to 40 pulses. However, the present invention should not be limited to only the above-noted numbers of sampling pulses. While the main CPU 26 is held in the partial gas replacement mode, excitation intensity adjustment is carried out four times and superposition adjustment is carried out five times. However, the present invention should not be limited only to the numbers of adjustments. Any number of adjustments may be carried out, if it is proven that no competition or interference takes place between the excitation intensity control and the superposition control but stable laser power is obtainable.

Next, the superposition control for allowing the center wavelength of laser light transmitting through the etalon 4 to correctly coincide with the center wavelength of laser light transmitting through the etalon 5 will be described in more details in the following.

Figure 3:
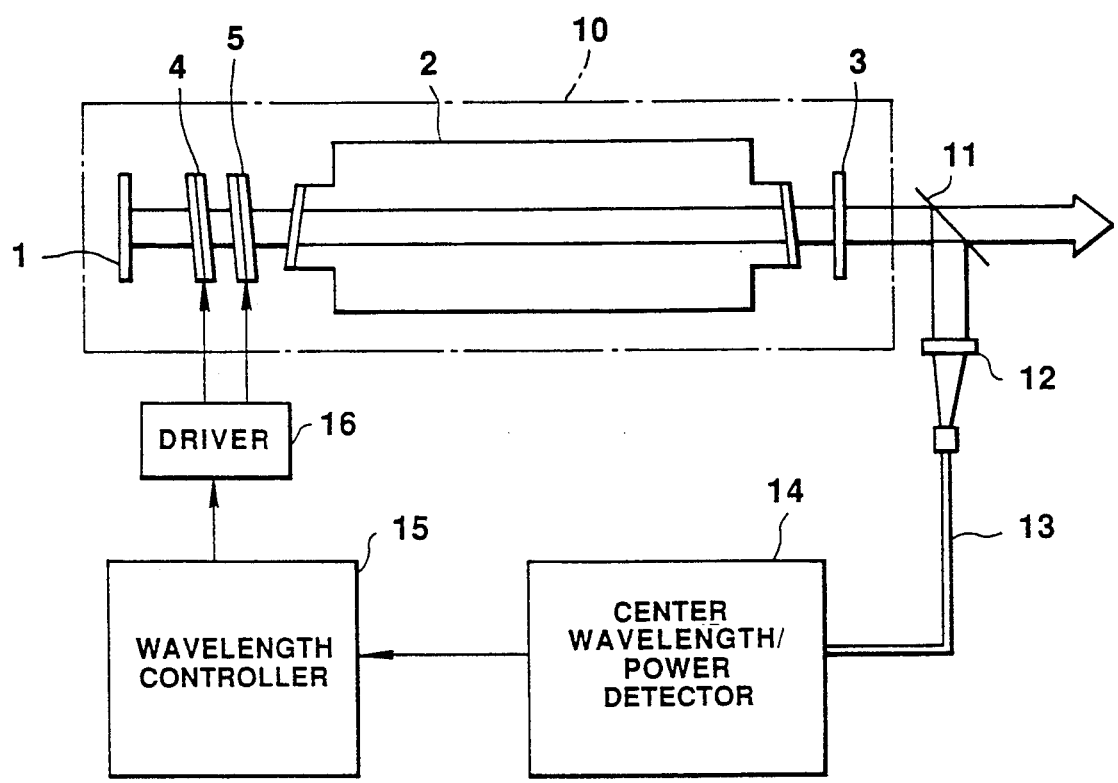
FIG. 3 is a block diagram which schematically illustrates only a wavelength control system extracted from the apparatus shown in FIG. 1.

FIG. 3 is a partial view extracted from FIG. 1 to illustrate a part associated with the superposition control. A part of laser light outputted from the excimer laser device 10 is taken out as sample light via the beam splitter 11 and then enters the oscillation center wavelength/center wavelength power detector 14 via a lens 12 and an optical fiber 13.

The oscillation center wavelength/center wavelength power detector 14 detects an oscillation center wavelength λ and a center wavelength power Pλ included in the sample light taken from the excimer laser device 10. A detector as shown in FIG. 5 is used for the oscillation center wavelength/center wavelength power detector 14.

Figure 5:
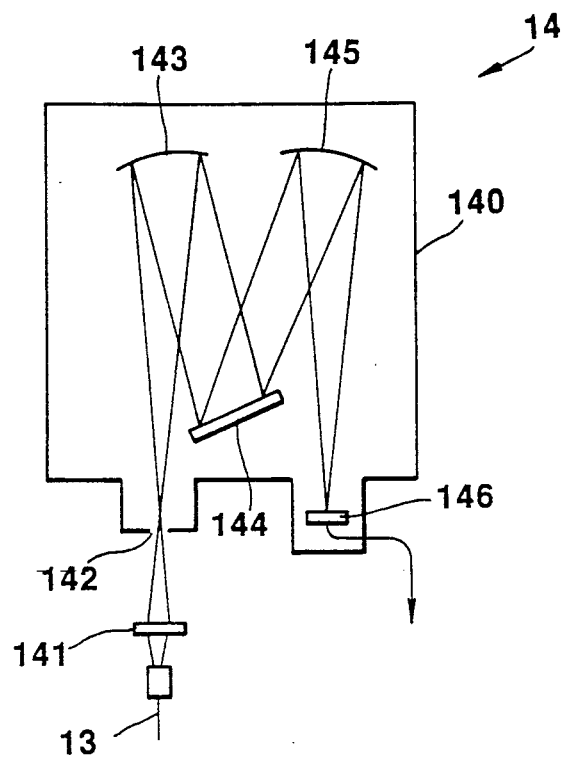
FIG. 5 is an explanatory view which schematically illustrates an oscillation center wavelength/center wavelength power detector in the wavelength control system shown in FIG. 3.

The oscillation center wavelength/center wavelength power detector 14 shown in FIG. 5 includes a diffraction grating type spectroscope 140 and a light position sensor 146, and the diffraction grating type spectroscope 140 comprises two concave mirrors 143 and 145 and a diffraction grating 144. Sample light to be inputted into the oscillation center wavelength/center wavelength power detector 14 via the optical fiber 13 is first collected in a lens 141 and it is then introduced into the interior of the oscillation center wavelength/center wavelength power detector 14 via an incident slit 142. The light which has been introduced thereinto via the incident slit 142 is reflected at the concave mirror 143 to become parallel light which in turn is irradiated toward the diffraction grating 144. The diffraction grating 144 is fixedly held with a predetermined angle so that incident light is reflected at a diffraction angle corresponding to the wavelength thereof. The diffracted light is conducted to the concave mirror 145 and the reflected light is then conducted from the concave mirror 145 to the light position sensor 146 to build an image. Namely, the diffracted image of the incident slit 142 corresponding to the wavelength of the incident light is built on the light receiving surface of the light position sensor 146, whereby the center wavelength $\lambda$ of the sample light can be detected based on the position where the diffracted image of the incident slit 142 is built on the light receiving surface of the light position sensor 146. The center wavelength power P$\lambda$ can be detected based on an intensity of light derived from the diffracted image of the incident slit 142.

Figure 6:
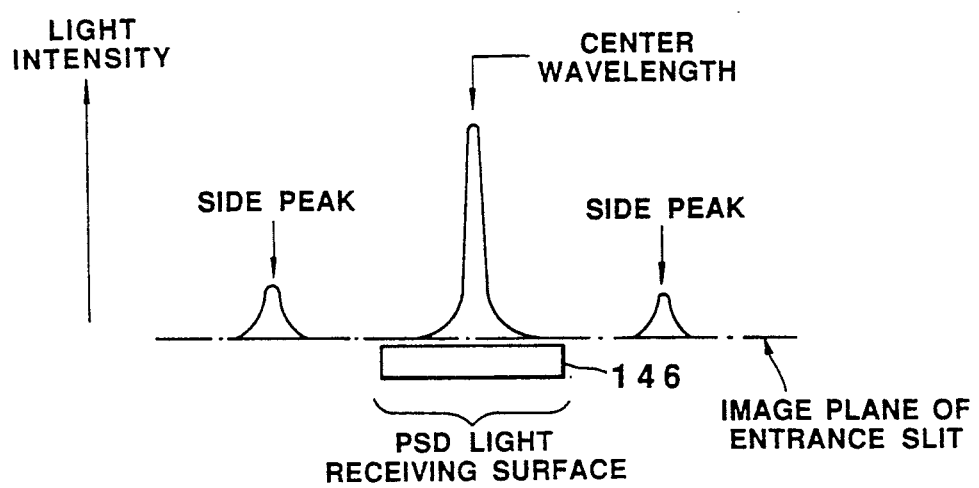
FIG. 6 is a graph which illustrates operations to be performed by the apparatus in a case where a position sensitive device is used as a light position detector for the detector shown in FIG. 5.

It should be noted that a photodiod array, a position sensitive device (hereinafter referred to as PSD) or the like device is employable for the light position sensor 146. In a case where the photodiod array is used for the light position sensor 146, a center wavelength is detected from the position assumed by a channel through which a highest intensity of light is received and the center wavelength power is detected based on a sum of intensity of each light passing through a channel corresponding to the center wavelength or a sum of intensity of light passing through a channel in a certain photodiod in the proximity of the center wavelength. In a case where the PSD is used for the light position sensor 146, dimensions of the light receiving surface of the PSD are determined so as not to receive side peaks as shown in FIG. 6 so that a central wavelength is detected based on an output from the PSD and center wavelength power is detected based on an intensity of the received light.

The center wavelength $\lambda$ and the central wavelength power P$\lambda$ which have been detected by the oscillation center wavelength/center wavelength power detector 14 are inputted into the wavelength controller 15.

The wavelength controller 15 controls a property of wavelength selection (representing a property of selecting the center wavelength of transmitted laser light) via the driver 16 so that the center wavelength of sample light, i.e., laser light outputted from the excimer laser device 10 correctly coincides with a required wavelength and the center wavelength power is maximized. It should be noted that control of a property of wavelength selection of each of the etalons 4 and 5 is carried out in connection with control of a temperature of each of the etalons 4 and 5, control of an angle of each of the etalons 4 and 5, control of pressure in an air gap between the etalons 4 and 5 and control of a size of the air gap between the etalons 4 and 5. For example, in a case where control of an angle of each of the etalons 4 and 5 is employed for the above described purpose, an angle adjusting mechanism as shown in FIG. 7 can be used.

Figure 7:
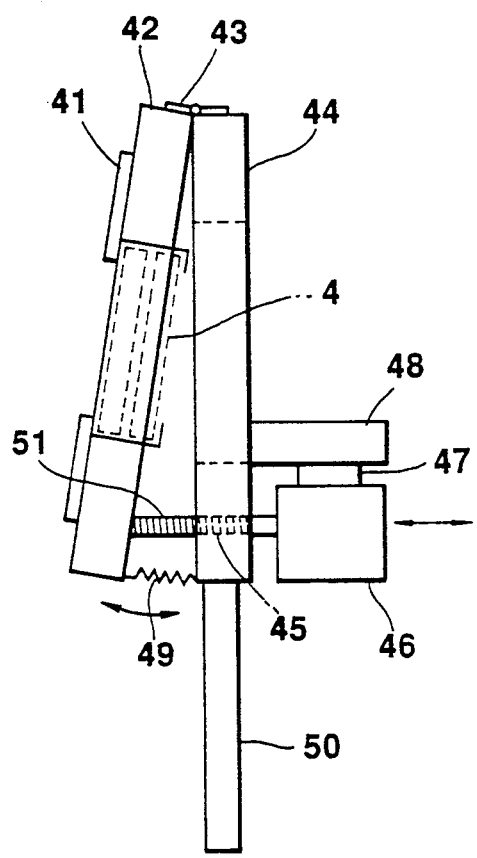
FIG. 7 is a side view which illustrates by way of example an angle adjusting mechanism.

Referring to FIG. 7, the etalon 4 is fitted to an etalon fitting plate 42 via an etalon holder 41 and the etalon fitting plate 42 is turnably secured to a base plate 44 at its upper end via a hinge 43. The base plate 44 is formed with a threaded hole 45 at its lower end into which a screw 51 is threadably inserted, one end of the screw 51 coming in contact with the etalon fitting plate 42 and the other end of the same being operatively connected to a pulse motor 46. The pulse motor 46 is fitted to a pulse motor fitting plate 48 so as to allow it to move in the direction of displacement of the screw 51 via a linear guide 47. To assure that the screw 51 comes in contact with the etalon fitting plate 47, a spring 49 is interposed between the etalon fitting plate 42 and the base plate 44. With such construction, an angle of the etalon 4 relative to an optical axis can be controlled with high accuracy by controlling the pulse motor 46 via the driver 16. It should be added that a rod 50 shown in FIG. 7 is used for allowing the angle adjusting mechanism to be firmly mounted on a housing of the excimer laser device 10 via the rod 50.

Prior to detailed description on a controlling operation to be performed by the wavelength controller 15, a principle of the controlling operation will be described below with reference to FIG. 4.

Figure 4:
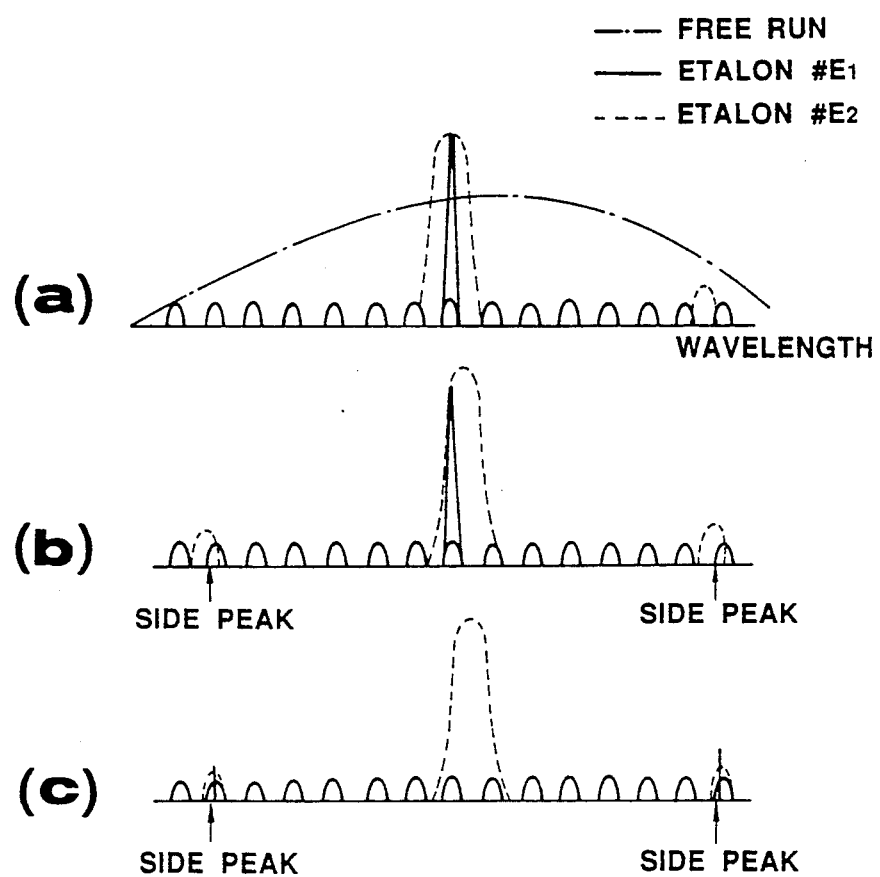
FIG. 4 shows a plurality of graphs which illustrate a principle of controlling a wavelength in accordance with the present invention, respectively.

FIG. 4 shows a plurality of graphs which illustrate a property of wavelength selection of each of the two etalons 4 and 5 of which free space spectrum is different from each other. The wavelength selection property of an etalon #E1 (e.g., etalon 4) having a smaller free spectrum range is represented by a solid line, while the wavelength selection property of an etalon #E2 (e.g., etalon 5) having a larger space spectrum range is represented by a dotted line. In a case of the excimer laser device 10 shown in FIG. 3, oscillation occurs in a wavelength region where the wavelength selection property of the etalon #E1 is superposed on the wavelength selection property of the etalon #E2, whereby an output laser light having a wavelength corresponding to the superposed region is obtainable. As is apparent from FIG. 4, in a case where the transmitted laser light center wavelength of the etalon #E1 coincides with that of the etalon #E2, as shown in FIG. 4 (a), a maximum intensity of output laser light power can be obtained. However, when the transmitted laser light center wavelength of the etalon #E1 is deviated from that of the etalon #E2, as shown in FIGS. 4(b) and 4(c), an intensity of the output laser light power is reduced but a magnitude of each side peak is increased in the fashion of an exponential function. It can readily be understood by any expert in the art that multi-wavelength oscillation occurs due to the above-described behavior of each etalon. In a case where the transmitted laser light center wavelength of the etalon #E1 having a smaller free spectrum range is fixed and the transmitted laser light center wavelength of the etalon #E2 is shifted, it has been confirmed by a variety of experiments that an oscillation center wavelength of the excimer laser device varies few.

In view of the aforementioned fact, the wavelength controller 15 for the apparatus in accordance with the shown embodiment of the present invention performs a controlling operation in such a manner that a difference $\Delta\lambda$ ($=\lambda-\lambda0$) between the oscillation center wavelength $\lambda$ detected by the oscillation center wavelength/center wavelength power detector 14 and a preset wavelength $\lambda0$ is calculated, the oscillation center wavelength is fixed to a required set wavelength by shifting the transmitted laser light center wavelength of the etalon #E1 having a smaller free spectrum range or the both etalons #E1 and #E2 and thereafter the transmitted laser light center wavelength of the etalon #E1 is superposed on that of the etalon #E2 by shifting the transmitted laser light center wavelength of the etalon #E2 having a larger free spectrum range in the direction of increasing of an intensity of output laser light power.

Figure 8:
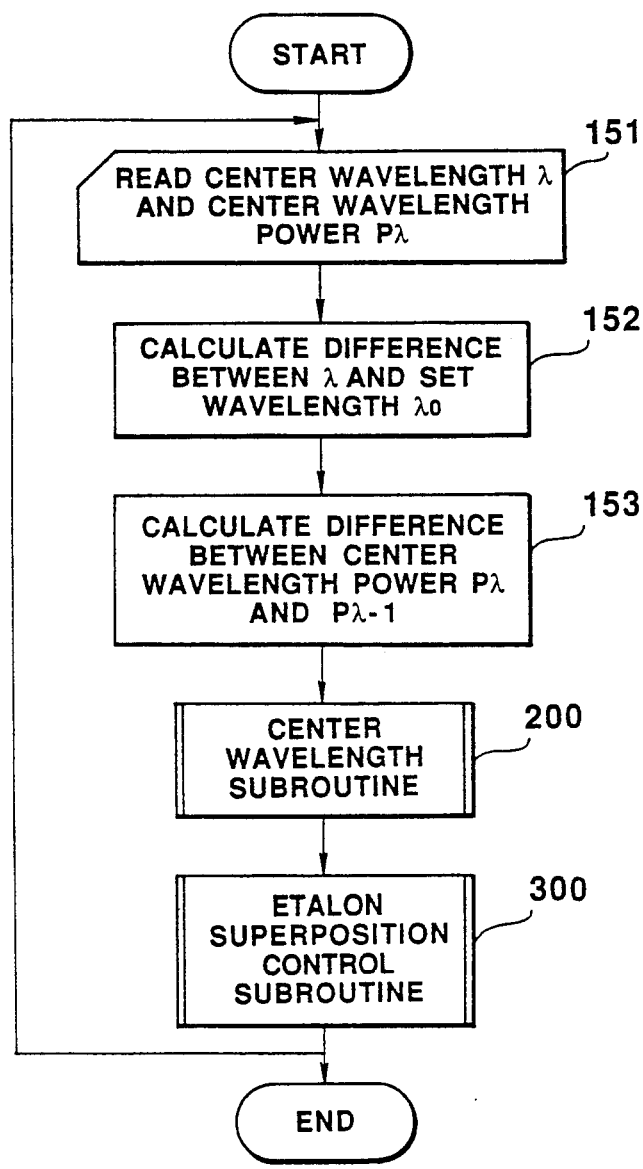
FIGS. 8 to 11 are a flowchart which illustrates operations to be performed by the apparatus shown in FIG. 1, respectively.

FIG. 8 is a flowchart which illustrates by way of example controlling operations to be performed by the wavelength controller 15. First, at a step 151, the controller 15 reads an oscillation center wavelength and center wavelength power. At this step, the controller 15 samples a predetermined number of oscillated laser pulses and calculates an oscillation center wavelength $\lambda$ and center wavelength power $P\lambda$ by averaging results derived from the sampling operation. The reason why such a step of processing as described above is executed resides in that an intensity of outputted laser light power fluctuates per each pulse, since the excimer laser device comprises a pulsed gas laser device.

Next, at a step 152, the controller 15 calculates a difference $\Delta\lambda$ between the detected center wavelength $\lambda$ and a required wavelength $\lambda 0$ which has been preset ($\Delta\lambda=\lambda-\lambda 0$).

Subsequently, at a step 152, the controller 15 calculates a difference $\Delta P\lambda$ between the center wavelength power $P\lambda$ derived from the present sampling operation (which has been read) and the center wavelength power $P\lambda-1$ derived from the preceding sampling operation ($\Delta P\lambda=P\lambda-(P\lambda-1)$). Thereafter, the program goes to a center wavelength control subroutine 200.

Figure 9:
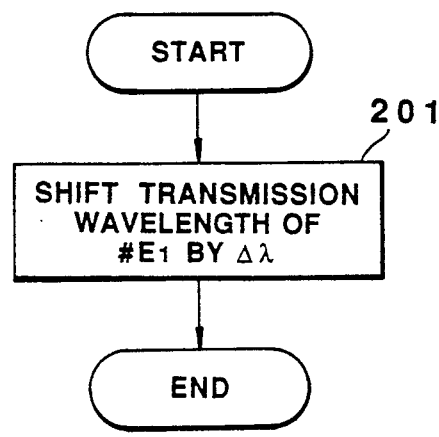
Figure 10:
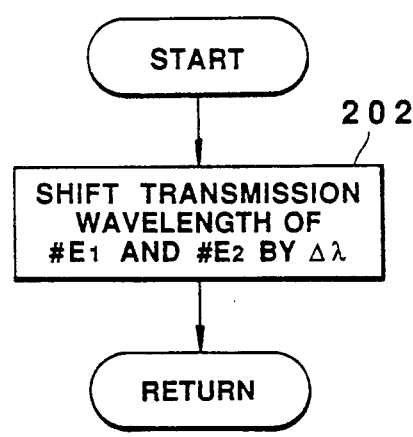

The content of the center wavelength control subroutine 200 is as shown in FIG. 9. In detail, at the center wavelength control subroutine 200, the controller 15 performs a controlling operation for shifting the transmitted laser light wavelength of the etalon #E1 having a smaller free spectrum range by a value $\Delta\lambda$ derived from the calculation at the step 152 (step 201). It should be added that the apparatus may be constructed such that the controller 15 shifts not only the transmitted laser light wavelength of the etalon #E1 having a smaller free spectrum range but also the transmitted laser light wavelength of the etalon #E2 having a larger spectrum range. The content of the center wavelength control subroutine 200 employable in such case is shown in FIG. 10. Referring to FIG. 10, the controller 15 performs a controlling operation for shifting the transmitted laser light wavelengths of the both etalons #E1 and #E2 by a value $\Delta\lambda$ (step 202).

Figure 11:
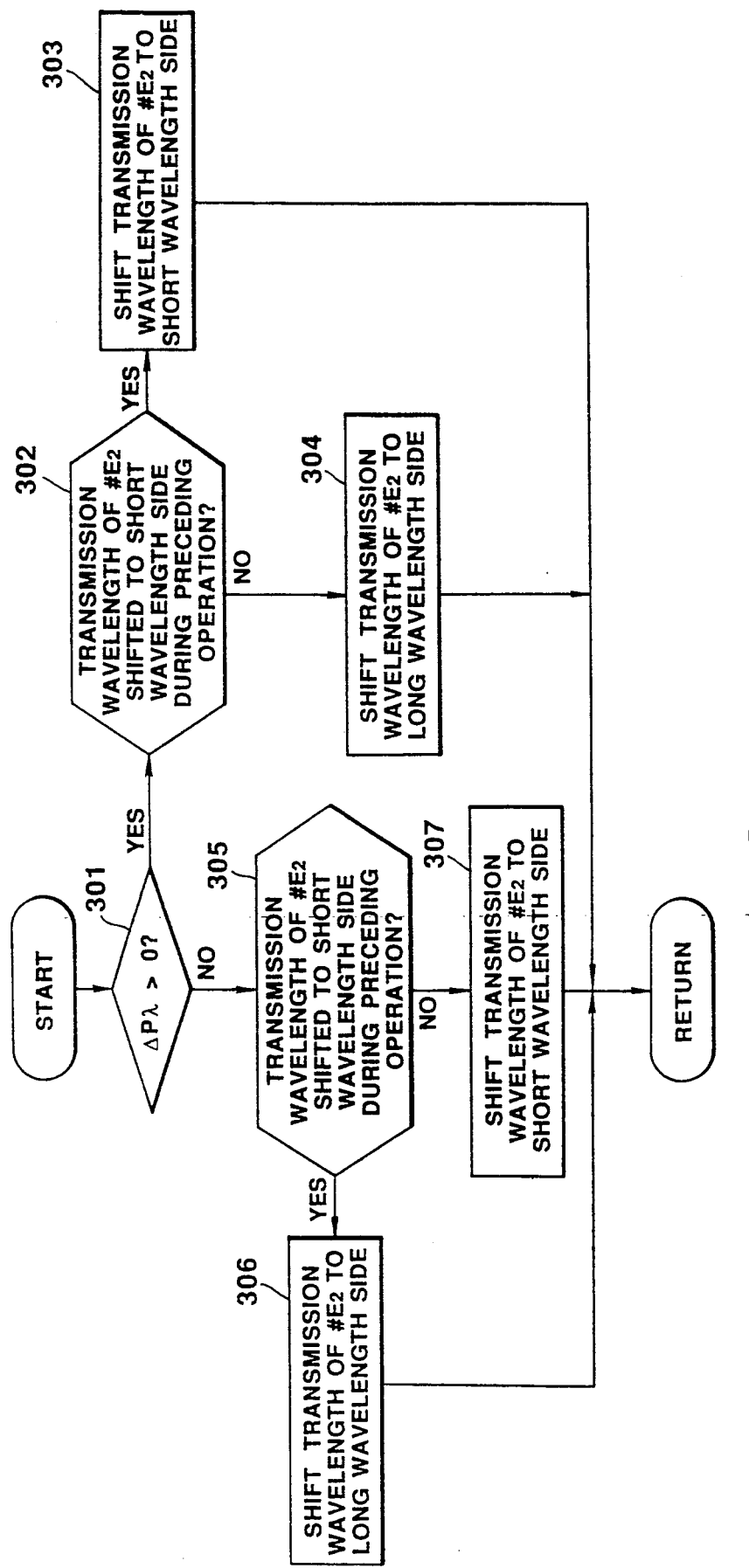

On completion of the center wavelength control subroutine 200, the program goes to an etalon superposition control subroutine 300. The content of the etalon superposition control subroutine 300 is shown in FIG. 11. First, at a step 301, the controller 15 determines whether the value $\Delta P\lambda$ derived from the calculation at the step 153 is positive (i.e., $\Delta P\lambda$ is more than zero) or not. If a result derived from the determination is YES, i.e., $\Delta P\lambda$ is more than zero, the program goes sideward to a step 302 at which the controller 15 determines whether or not the transmitted laser light wavelength of the etalon #E2 having a larger free spectrum range has been shifted to the short wavelength side during the preceding controlling operation (during the preceding sampling operation). If a result derived from the determination is YES, i.e., it has been determined that the transmitted laser light wavelength of the etalon #E1 has been shifted to the short wavelength side, the program goes sideward to a step 303 at which the controller 15 shifts further the transmitted laser light wavelength of the etalon #E2 to the short wavelength side by a predetermined very small wavelength. If it is determined at the step 302 that the transmitted laser light wavelength of the etalon #E2 has been shifted to the long wavelength side during the preceding controlling operation, the program goes to a step 304 at which the controller 15 shifts the transmitted laser light wavelength of the etalon #E2 by a predetermined very short wavelength.

If it is determined at the step 301 that a $\Delta P\lambda$ is equal to or less than zero, the program goes to a step 305. At the step 305, the controller 15 determines whether or not the transmitted laser light wavelength of the etalon #E2 has been shifted to the short wavelength side during the preceding controlling operation (during the preceding sampling operation). If it is determined that the transmitted laser light of the etalon #E2 has been shifted to the short wavelength side, the program goes sideward to a step 306 at which the controller 15 shifts the transmitted laser light wavelength of the etalon #E2 to the long wavelength side by a predetermined very short wavelength. If it is determined at the step 305 that the transmitted laser light wavelength of the etalon #E2 has been shifted to the long wavelength side during the preceding controlling operation, the program goes to a step 307 at which the controller 15 shifts the transmitted laser light wavelength of the etalon #W2 to the short wavelength side by a predetermined very short wavelength.

In such manner, at the etalon superposition control subroutine 300, the controller 15 determines the direction of shifting of the transmitted laser light wavelength of the etalon #E2 to increase an intensity of outputted laser light power, based on the code of the value $\Delta P\lambda$ and the direction of shifting of the transmitted laser light during the preceding controlling operation, whereby the transmitted laser light wavelength of the etalon #E2 is shifted in the thus determined direction.

Figures 12A, 12B, 12C:
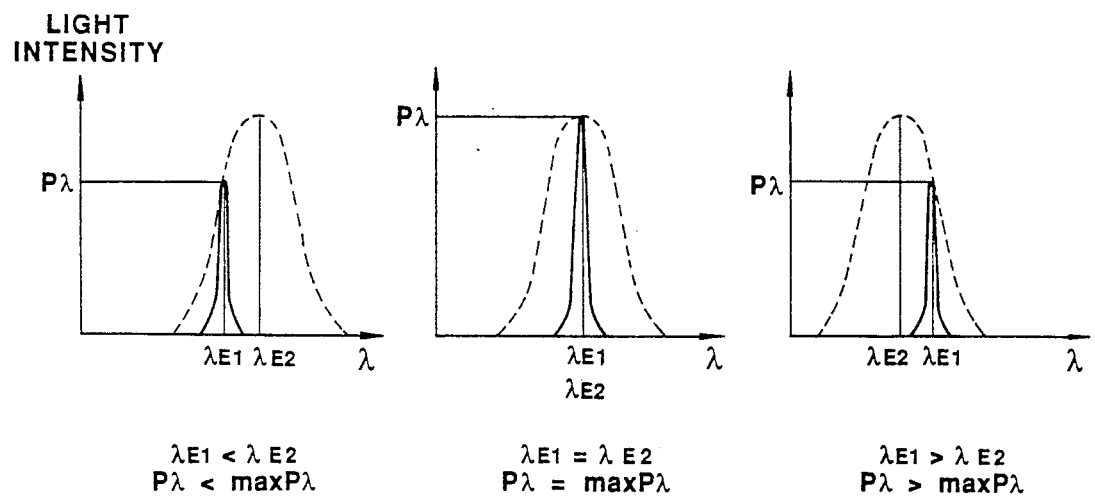
FIG. 12 shows a plurality of spectrum graphs which illustrate a relationship between a transmitted laser light wavelength spectrum of an etalon and an actual laser oscillation spectrum with the apparatus of the present invention, respectively.

FIG. 12 shows a plurality of graphs which illustrate a relationship between the transmitted laser light spectrum of the etalon #E2 and the actual laser oscillation spectrum based on a relationship of superposition between the both etalons #E1 and #E2. Referring to FIG. 12, wave shapes represented by dotted lines show a transmitted laser light spectrum of the etalon #E2, respectively. Further, in FIG. 12, $\lambda E1$ designates a transmitted laser light center wavelength of the etalon #E1 and $\lambda E2$ designates a transmitted laser light center wavelength of the etalon #E2. As is apparent from FIG. 12, a maximum outputted laser light power maxP$\lambda$ can be obtained at a state shown in FIG. 12(b) wherein the transmitted laser light center wavelength $\lambda E1$ of the etalon #E1 and the transmitted laser light center wavelength $\lambda E2$ of the etalon #E2 are completely superposed each other but the maximum outputted laser light power can not be obtained at a state shown in FIG. 12(a) or FIG. 12(c) wherein superposition is accomplished insufficiently.

Figure 13:
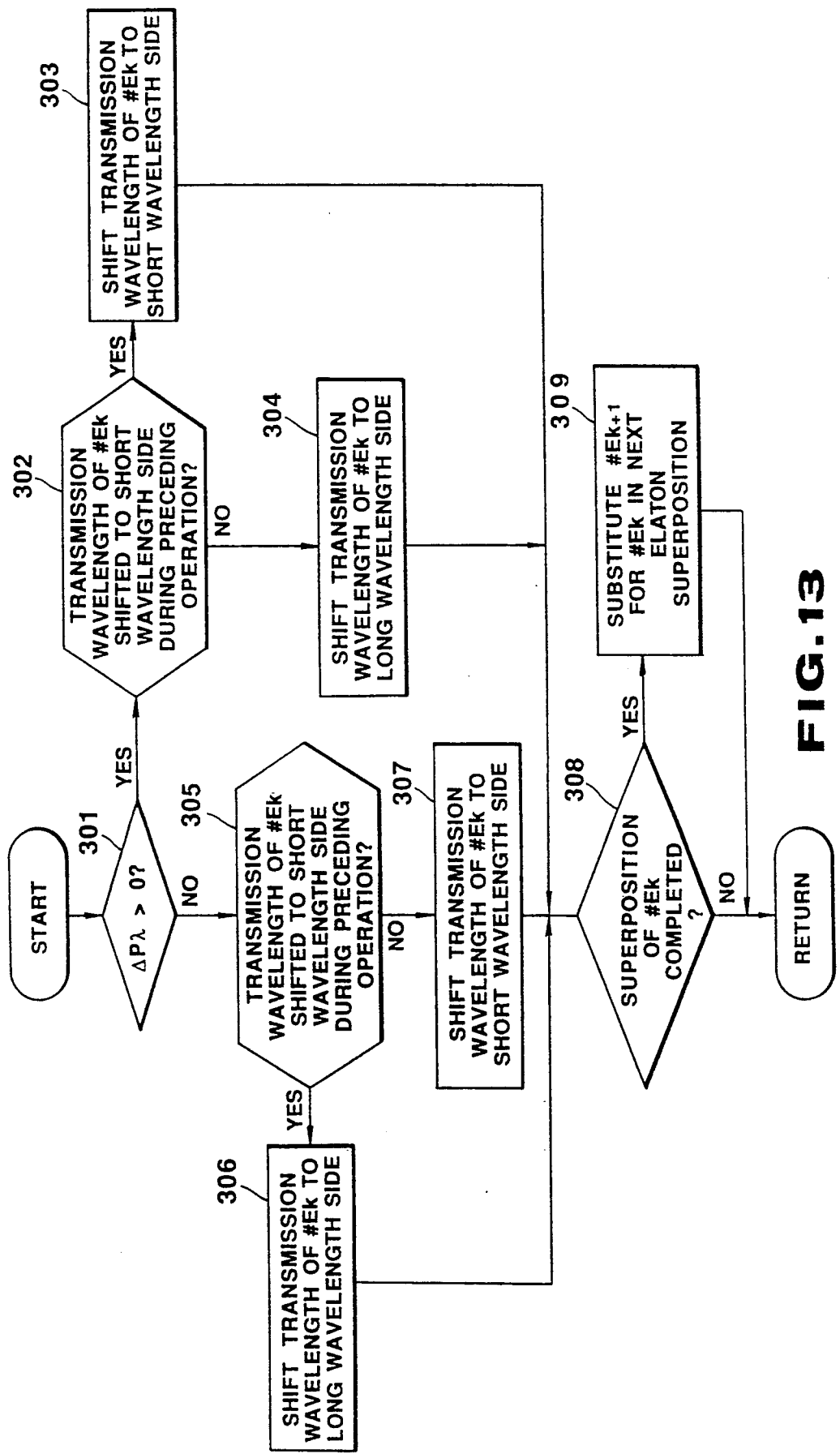
FIG. 13 is a flowchart which illustrates an etalon superposition subroutine to be executed by the apparatus of the present invention wherein the subroutine is modified from the program in the form of a flowchart shown in FIG. 8.

FIG. 13 is a flowchart which illustrates by way of example a modified embodiment of the etalon superposition control subroutine 300. The flowchart in accordance with the modified embodiment shows a case where the number of etalons interposed between a rear mirror and a laser chamber for the excimer laser device is three or more, i.e., a case where etalons adapted to receive superposition control comprise a plurality of etalons #E2, #E3,—#En. Controlling operations shown in FIG. 13 are basically identical to those in FIG. 8. It should be noted that, to perform controlling operations for the plural etalons #E2, E3,—, #En, a step 308 and a step 309 are added to the flowchart shown in FIG. 11. Specifically, at the step 308, the controller 15 determines whether superposition of an etalon #Ek which has been controlled at present is completed or not. If it is determined that the superposition is completed, the program goes sideward to the step 309 at which the controller 15 executes a processing so as to allow superposition control of an etalon #Ek+1 to be carried out during next etalon superposition control instead of the etalon #Ek. This controlling operation continues until k becomes n. According to the modified embodiment shown in FIG. 13, the apparatus is constructed such that the etalons #E2 to #En are successively controlled but an order of controlling operations to be performed may be determined arbitrarily. When superposition control is executed for all the etalons #E2 to #En, a maximum outputted laser light power can be obtained.

Figure 14:
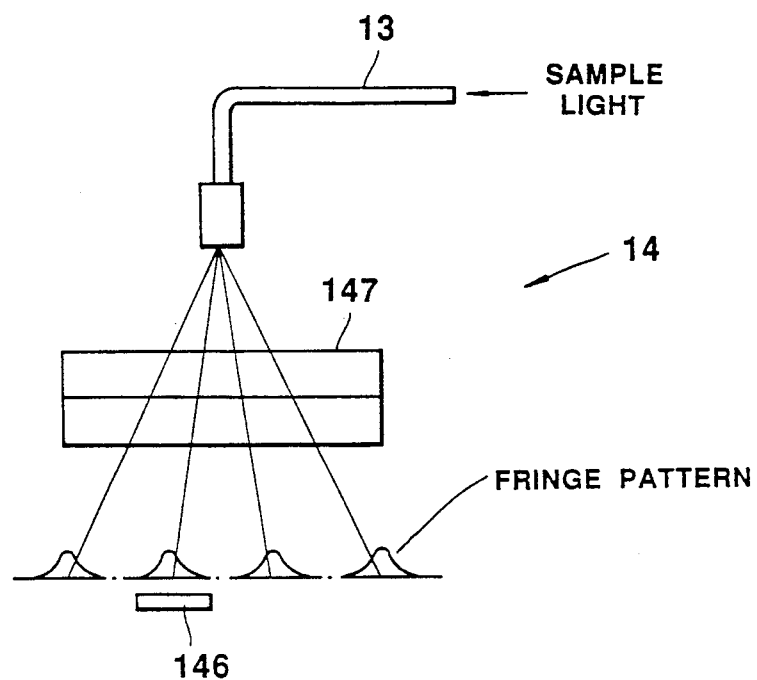
FIG. 14 is an explanatory view which schematically illustrates an oscillation center wavelength/center wavelength power detector modified from that shown in FIG. 6.

FIG. 14 is an explanatory view which illustrates by way of example an oscillation center wavelength/center wavelength power detector 14 in accordance with a modified embodiment of the present invention wherein it is constructed using a monitor etalon. According to this modified embodiment, a monitor etalon 147 is substituted for the diffraction grating type spectroscope 140 shown in FIG. 5.

As shown in FIG. 14, a light position sensor 146 is disposed at a position where a plurality of fringe patterns produced by the monitor etalon 147 can be detected. This arrangement makes it possible to detect a center wavelength by utilizing the fact that the fringe patterns are displaced as the center wavelength varies.

It suffices that a photodiod array or PSD is used for the light position sensor 146.

In the case of a photodiod array, power of laser light at the center wavelength can be detected from an intensity of light detected via a channel in the photodiod array where the center wavelength is located or from a sum of each intensity of light detected via a channels in a certain photodiod located in the proximity of the center wavelength.

In a case where the PSD is employed for the same purpose, the center wavelength power can be detected from an output from the PSD by disposing the latter so as not to allow fringe patterns representative of side peaks to be received on the light receiving surface of the PSD.

It should be added that in the case where the photodiod array is used, it may be disposed in a such a manner that a plurality of fringe patterns are not received on the light receiving surface thereof When it is assumed that a difference between a peak wavelength of side peaks and the center wavelength is represented by $\Delta\lambda$ side and a free spectrum range of the monitor etalon is represented by a FSR monitor, the monitor etalon 147 can be designed in an optimum manner when the following relationship is established.

$$\Delta\lambda\text{side} \neq n \cdot FSR\text{moniter}$$
$$(n = 1,2,3 \ldots)$$

This arrangement assures that fringe patterns caused by the spectrum inclusive the center wavelength and fringe patterns caused by the side peaks are not superposed each other.

Figure 15:
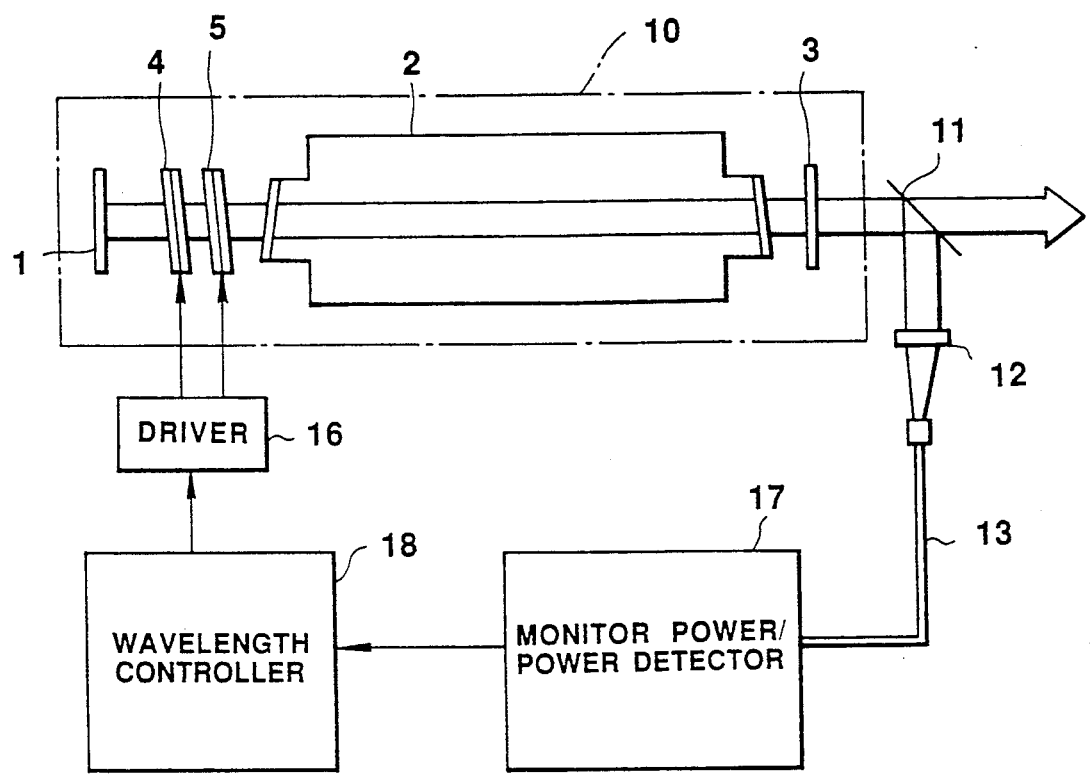
FIG. 15 is a block diagram which schematically illustrates an apparatus for controlling an output from an excimer laser device in accordance with other embodiment of the present invention.

FIG. 15 is a block diagram which schematically illustrates an apparatus for controlling an output from an excimer laser device in accordance with other embodiment of the present invention. This embodiment consists in that the apparatus does not directly detect an oscillation wavelength of the excimer laser device 10 but control the oscillation wavelength of the same to a required wavelength. In contrast with the embodiment shown in FIG. 1, a monitor power/predetermined wavelength component power detector 17 is substituted for the oscillation center wavelength/center wavelength power detector 14 to detect monitor power and predetermined wavelength component power and thereby the structure of a wavelength controller 18 is different from the wavelength controller 15 shown in FIG. 3 to some extent.

The monitor power/predetermined wavelength component power detector 17 detects an intensity of sample light which has been inputted thereinto via an optical fiber 13, as monitor power and further detects predetermined wavelength component of the sample light as predetermined wavelength component power. The monitor power/predetermined wavelength component detector 17 can be constructed as shown in FIG. 16.

Figure 16:
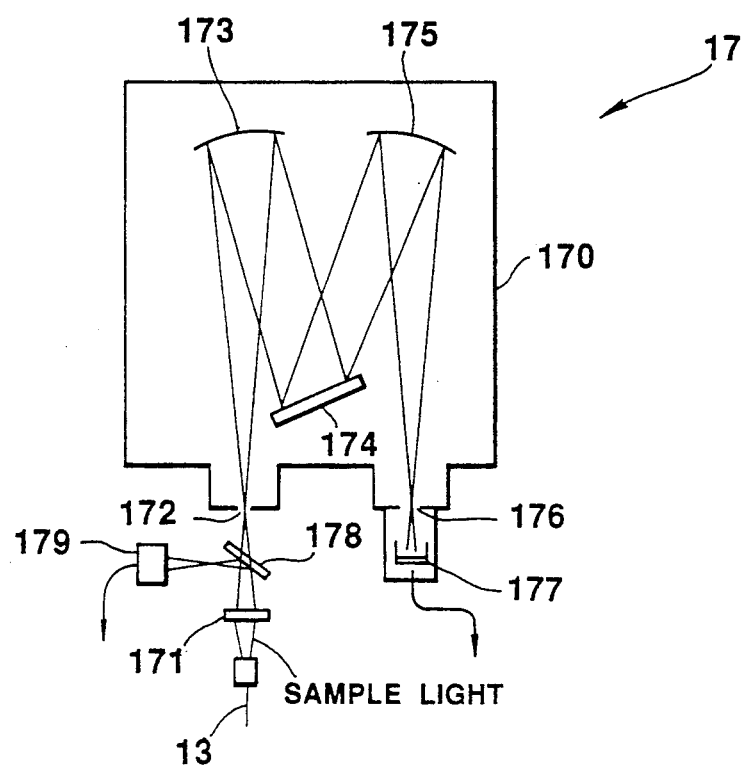
FIG. 16 is an explanatory view which illustrates in detail a monitor power/predetermined wavelength component power detector for the apparatus shown in FIG. 15, FIGS. 17 to 19 are a flowchart which illustrate operation to be performed by the apparatus shown in FIG. 15, respectively.

In detail, the monitor power/predetermined wavelength component power detector 17 shown in FIG. 16 includes a diffraction grating type spectroscope 170 comprising concave mirrors 173 and 175 and a diffraction grating 174, a first light intensity detector 179 for detecting monitor component power and a second light intensity detector 177 for detecting predetermined wavelength component power.

Sample light which has been inputted via the optical fiber 13 is collected by a lens 171 and the thus collected light is introduced into the interior of the monitor power/predetermined wavelength component power detector 17 via a beam splitter 178 and an incident slit 172 of the spectroscope 170. The light which has been introduced via the incident slit 172 is reflected at the concave mirror 173 and then irradiated toward the diffraction grating 174. The diffraction grating 174 is immovably held with a predetermined angle, whereby the incident light is diffracted in correspondence to a wavelength of the incident light. The diffracted light is conducted to the concave mirror 175 and the reflected light from the concave mirror 175 builds an image on an outlet slit 176 in the form of a diffracted image. Thereafter, the reflected light is further conducted to the second light intensity detector 177 to detect an intensity of the light which has transmitted through the outlet slit 176.

A part of the light which has been collected at the lens 171 is reflected by a half mirror 178 and then conducted to the first light intensity detector 179.

Namely, with the monitor power/predetermined wavelength component power detector 17, only a required wavelength component which has been set to an angle assumed by the diffraction grating 174 is conducted to the second light intensity detector 177. Consequently, an intensity of light having a required set wavelength component is detected by the second light intensity detector 177 as a predetermined wavelength component P$\lambda$. Since the sample light which has been inputted via the optical fiber 13 is inputted into the first light intensity detector 179 as it is left unchanged, an intensity of the inputted sample light is detected as monitor power PL. It should be noted that a photomultiplier, a photodiod array or the like device can be used for the first light intensity detector 179 and the second light intensity detector 177.

The monitor power PL of the sample light which has been detected by the monitor power/predetermined wavelength component power detector 17 and the predetermined wavelength component power Pλ are inputted into a wavelength controller 18.

The wavelength controller 18 controls a property of wavelength selection (i.e., property of selecting a wavelength of transmitted laser light) of the etalons 4 and 5 via a driver 16 based on the inputted monitor power PL and the predetermined wavelength component power Pλ.

Figure 17:
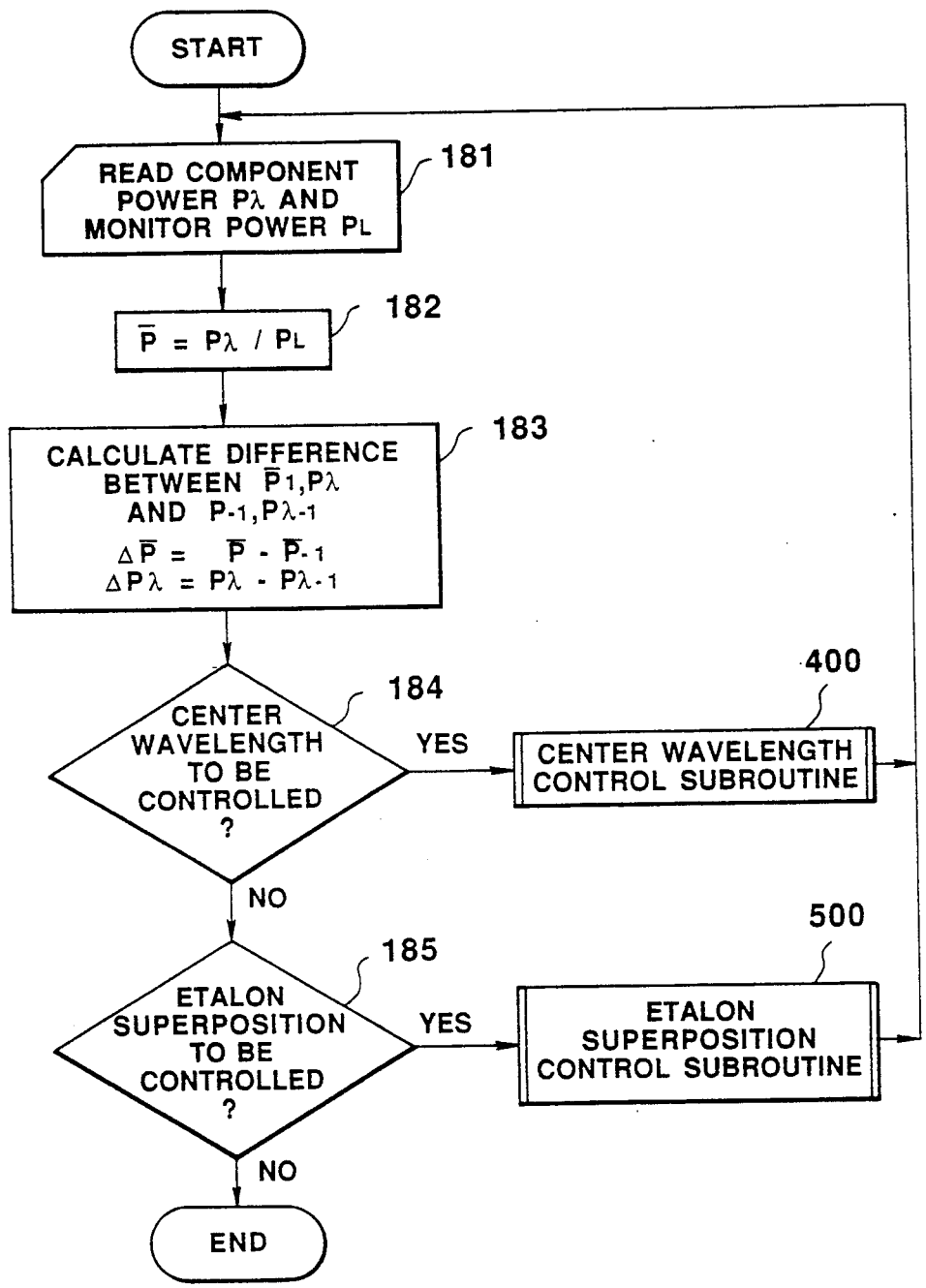

FIG. 17 is a flowchart which illustrate by way of example controlling operations to be performed by the wavelength controller 18.

First, at a step 181 the controller 18 reads the monitor power PL and the predetermined wavelength component power Pλ which has been inputted from the monitor power/predetermined wavelength component power detector 127. At the step 181, the controller 18 samples a predetermined number of laser pulses which have been oscillated in the same manner at the step 151 in FIG. 8 and then calculates the predetermined wavelength component power Pλ by averaging the laser pulses.

Next, at a step 182, the controller 18 divides the predetermined wavelength component power P which has been read and calculated at the step 181 with the monitor power PL so that the predetermined wavelength component power Pλ is specified ($\overline{P} = P\lambda/PL$).

Subsequently, at a step 183, the controller 18 calculates and $\Delta\overline{P}$ and $\Delta P\lambda$ which represent a difference between the predetermined wavelength component power $\overline{P}$ specified at the step 182 and the specified $\overline{P}_{-1}$ of the predetermined wavelength power sampled during the preceding controlling operation as well as a difference between the predetermined wavelength component power Pλ specified at the step 182 and the predetermined wavelength components power $\overline{P}\lambda - 1$ sampled during the preceding controlling operation ($\Delta\overline{P} = \overline{P} - \overline{P}_{-1}$, $\Delta P\lambda = P\lambda - (P\lambda - 1)$).

Next, at a step 184, the controller 18 determines whether center wavelength control is to be carried out or not. This determination is made based on the fact that center wavelength control was carried out during the preceding controlling operation or etalon superposition control was carried out during the preceding controlling operation. In detail, if it is found that etalon superposition control was carried out during the preceding controlling operation, the controller 18 determines that center wavelength control should be carried out. If it is found that center wavelength control was carried out during the preceding controlling operation, the controller 18 determines that center wavelength control should not be carried out any more. As will be apparent from description to be made later, this is because, according to this embodiment of the present invention, the apparatus is constructed such that center wavelength control and etalon superposition control are executed alternately.

If it is determined that center wavelength control is to be carried out at the step 184, the program goes sideward to a center wavelength control subroutine 400.

If it is determined at the step 184 that center wavelength control should not be carried out, the program goes to a step 185 at which the controller 18 determines whether etalon superposition control should be carried out or not. Also at the step 185, determination is made based on the fact that center wavelength control was carried out during the preceding controlling operation or etalon superposition control was carried out during the preceding controlling operation. If it is found that center wavelength control was carried out during the preceding controlling operation, the controller 18 determines that etalon superposition control should be carried out. If it is found that etalon superposition control was carried out during the preceding controlling operation, the controller 18 determines that etalon superposition control should not be carried out any more. If it is determined that etalon superposition control is to be carried out at the step 185, the program goes sideward to an etalon superposition subroutine 500.

Figure 18:
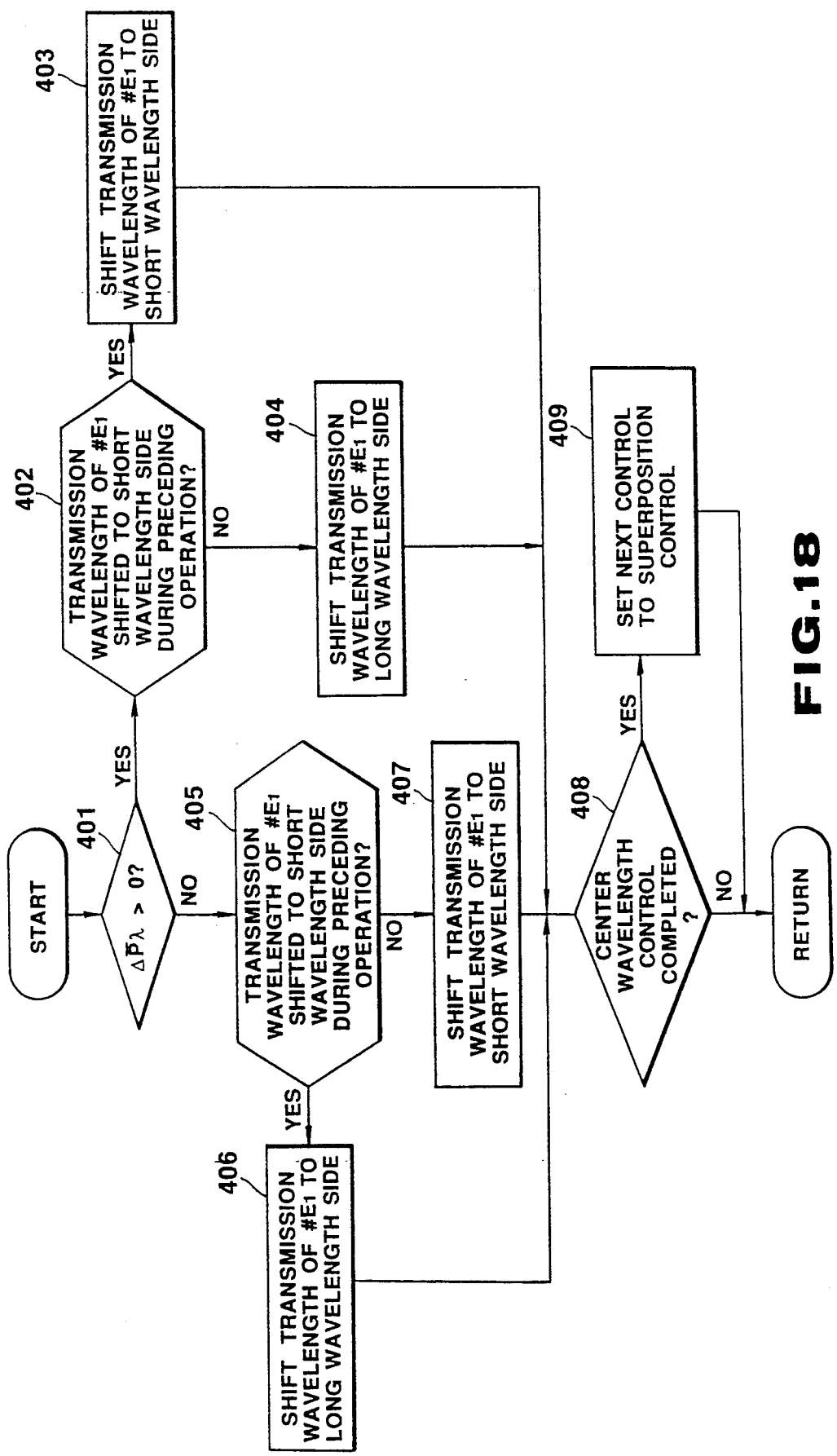

The content of the center wavelength control subroutine 4 is as shown in FIG. 18. First, at a step 401, the controller 18 determines whether a value $\Delta\overline{P}$ derived from the calculation at the step 183 is positive (i.e., $\Delta\overline{P} > 0$) is not. If it is determined that the value a $\Delta\overline{P}$ is positive, i.e., more than zero, the subroutine goes sideward to a step 402 at which the controller 18 determines whether transmitted laser light wavelength of the etalon #E1 having a smaller free spectrum range was shifted to the short wavelength side during the preceding controlling operation (i.e., during the preceding sampling operation) or not. If this determination reveals that the transmitted laser light wavelength of the etalon #E1 was shifted to the short wavelength side, the subroutine goes sideward to a step 403 at which the controller 18 shifts the transmitted laser light wavelength of the etalon #E1 to the shorter wavelength side. If it is determined at the step 402 that the transmitted laser light wavelength of the etalon #E1 was shifted to the long wavelength side during the preceding controlling operation, the subroutine goes to a step 404 at which the permeated laser light wavelength of the etalon #E1 is shifted to the long wavelength side.

If it is determined at the step 401 that the value $\Delta\overline{P}$ is equal to or less than zero, the subroutine goes to a step 405. At the step 405, the controller 18 determines whether the transmitted laser light wavelength of the etalon #E1 was shifted to the short wavelength side during the preceding controlling operation (during the preceding sampling operation) or not. If it is determined at this step that the transmitted laser light wavelength was shifted to the short wavelength side, the subroutine goes sideward to a step 406 at which the controller 18 shifts the transmitted laser light wavelength to the long wavelength side. If it is determined at the step 405 that the transmitted laser light wavelength of the etalon #E1 was shifted to the long wavelength side, the subroutine goes to a step 404 at which the controller 18 shifts the transmitted laser light wavelength of the etalon #E1 to the short wavelength side.

In this manner, the controller 18 determines the direction of shifting of the transmitted laser light wavelength of the etalon #E1 to increase an intensity of outputted power of laser light, based on the code of the value $\Delta\overline{P}$ and the direction of shifting of the transmitted laser light derived from the preceding controlling operation and then shifts the transmitted laser light wavelength of the etalon #E1 in the direction which has been determined in this way. It should be added that this embodiment has been described above as to a case where only the transmitted laser light wavelength of the etalon #E1 is shifted but the transmitted wavelength of the etalon #E1 and the transmitted laser light wavelength of the etalon #E2 may simultaneously be shifted by a same quantity.

On completion of the foregoing controlling operations, the subroutine goes to a step 408 at which the controller 18 determines whether center wavelength control has been completed or not. If it is determined at the step 408 that the center wavelength control has been completed, the subroutine goes sideward to a step 409 at which the controller 18 executes a processing of setting next superposition control to be carried out.

Figure 19:
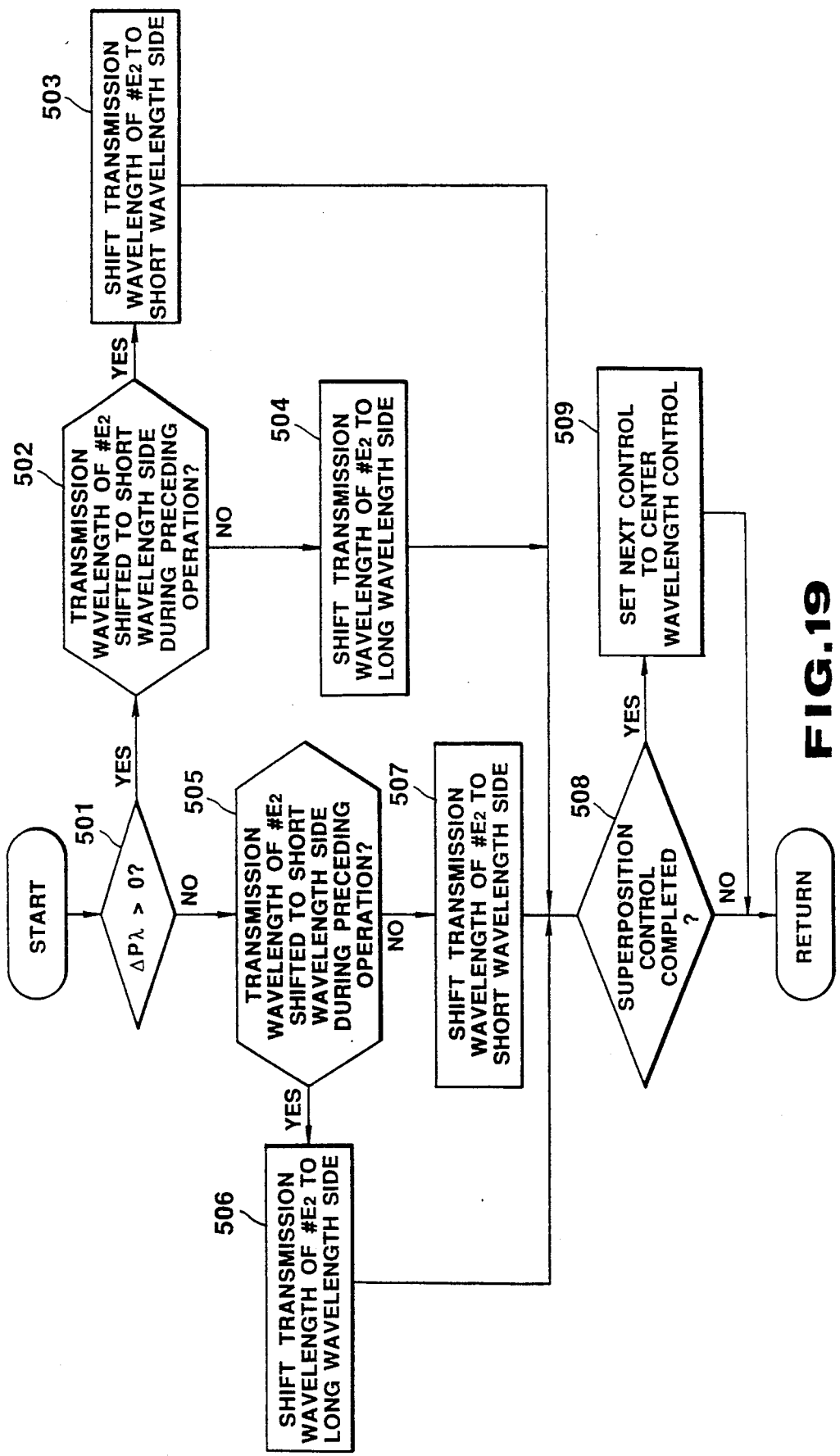

The content of the etalon superposition subroutine 500 is as shown in FIG. 19. First, at a step 501, the controller 18 determines whether a difference $\Delta P\lambda$ between the predetermined wavelength component power $P\lambda$ which was read and calculated at the step 181 and the predetermined wavelength component power $P\lambda - 1$ which was sampled at the preceding controlling operation is positive (i.e., $\Delta P\lambda > 0$) or not. If it is determined at the step 501 that $\Delta P\lambda$ is more than zero, the subroutine goes sideward to a step 502 at which the controller 18 determines whether the transmitted laser light wavelength of the etalon #E2 having a larger free spectrum range was shifted to the short wavelength side during the preceding controlling operation (during the preceding operation) or not. If it is determined at the step 502 that the transmitted laser light wavelength of the etalon #E2 was shifted to the short wavelength side, the subroutine goes sideward to a step 503 at which the controller 18 shifts further the transmitted laser light wavelength of the etalon #E2 to the short wavelength side. If it is determined at the step 502 that the transmitted laser light wavelength of the etalon #E2 was shifted to the long wave length side, the subroutine goes to a step 504 at which the controller 18 shifts the transmitted laser light wavelength of the etalon #E2 to the longer wavelength side.

If it is determined at the step 501 that $\Delta P$ is equal to or less than zero, the subroutine goes to a step 505. At the step 505, the controller 18 determines whether the transmitted laser light wavelength of the etalon #E2 was shifted to the short wavelength side during the preceding controlling operation (during the sampling operation) or not. If it is determined at the step 505 that the transmitted laser light wavelength of the etalon #E2 was shifted to the short wavelength side, the subroutine goes sideward to a step 506 at which the controller 18 shifts the transmitted laser light wavelength of the etalon #E2 to the long wavelength side. If it is determined at the step 505 that the transmitted laser light wavelength of the etalon #E2 was shifted to the long wavelength side, the subroutine goes to a step 507 at which the controller 18 shifts the permeated laser light wavelength of the etalon #E2 to the short wavelength side.

In this manner, the controller 18 determines the direction of shifting of the transmitted laser light wavelength of the etalon #E2 to increase an output power of laser light, based on the code of $\Delta P\lambda$ and the direction of shifting of the transmitted laser light wavelength derived from the preceding controlling operation, and then shifts the transmitted laser light wavelength of the etalon #E2 in the direction which has been determined in this manner.

On completion of the aforementioned controlling operation, the subroutine goes to a step 508 at which the controller determines whether superposition control has been completed or not. If it is determined at the step 508 that superposition control has been completed, the subroutine goes sideward to a step 509 at which the controller 18 executes a processing for setting next center wavelength control to be performed. In a case where three or more etalons are arranged in a laser oscillator, it suffices that superposition control is successively carried out for the etalons, as shown in FIG. 13.

Figure 20:
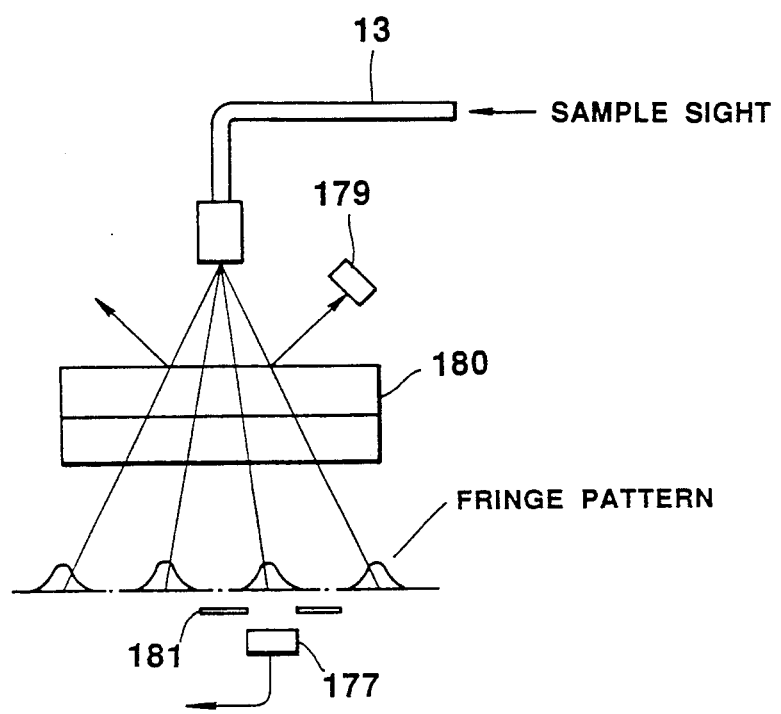
FIGS. 20 to 23 are an explanatory view which illustrates by way of example a monitor power/predetermined wavelength component power detector modified from that shown in FIG. 15, respectively.

FIG. 20 is an explanatory view which illustrates by way of example another modified embodiment of the present invention wherein the monitor power/predetermined wavelength component power detector 17 is constructed using a monitor etalon 180.

As shown in FIG. 20, a slit 181 is placed at a location where fringe patterns produced by the monitor etalon 180 can be detected and a second light intensity detector 177 is disposed at a position just behind the slit 181.

An intensity of sample light scattered by the monitor etalon 180 is measured by a second light intensity detector 179.

With such construction, monitor power and predetermined wavelength component power can be detected in the same manner as the arrangement as shown in FIG. 16.

Figure 21:
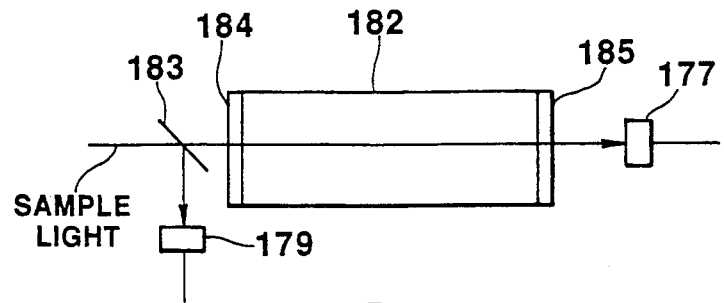

FIG. 21 is an explanatory view which schematically illustrates by way of example another structure of the monitor power/predetermined wavelength component power detector 17. In this example of structure, light absorption in the presence of gas atoms and molecules is utilized. Gas which exhibits light absorption at a required set center wavelength is contained in a gas containing cell 182. Sample light is introduced into the interior of the gas containing cell 182 via a beam splitter 183 and a window 184 and then conducted to a second light intensity detector 177 via another window 185. A part of the sample light is reflected at the beam splitter 183 and the reflected light is introduced into a first light intensity detector 179.

When a wavelength of the sample light does not coincide with a characteristic absorption wavelength of the gas contained in the gas containing cell 182, laser light transmitting through the gas containing cell 182 is few dampened. However, when the former correctly coincides with the latter, the transmitted laser light is dampened largely. The predetermined wavelength component power can be detected by measuring a quantity of dampened light using the second light intensity detector 177. In addition, the monitor power can be detected by the first light intensity detector 179.

Figure 22:
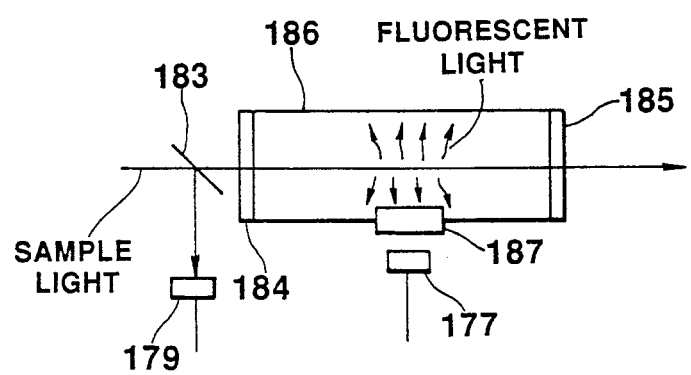

FIG. 22 is an explanatory view which schematically illustrates by way of example another structure of the monitor power/predetermined wavelength component power detector 17. In this example of structure, predetermined wavelength component power can be detected by utilizing fluorescent light (laser-inducing saturated fluorescent light which is hereinafter referred to as LIF) which is generated by light absorption in the presence of gas atoms and molecules. As shown in FIG. 22, gas which generates fluorescent light by absorption of light having a required set center wavelength is contained in a LIF cell 186. Fluorescent light which has been generated in the LIF cell 186 is taken out via a window 187 and the thus taken fluorescent light is detected by a second light intensity detector 177.

When a wavelength of the sample light which has been introduced into the interior of the LIF cell 186 via a beam splitter 183 and a window 184 coincides with a characteristic absorption wavelength of the gas contained in the LIF cell 186, gas atoms and molecules absorb laser light to generate fluorescent light (if not, no fluorescent light is generated).

The predetermined wavelength component power can be sensed by measuring an intensity of the fluorescent light using a light intensity detecting element A. On the other hand, the monitor power can be detected by a first light intensity detector 179.

In a case where a KrF narrow band oscillation type excimer laser device having a narrow operative range performs a tuning operation (representative of a selecting operation for oscillation wavelength) with a wavelength of about 248.35±0.2 nm, SO, $O_2$, $N_2O$, OCS, $C_6H_6$, $H_2CO$, $CH_3B_r$, $CH_3I$, $CF_3I$, $CH_3-C(=O)-CH_3$, N C—C CH or the like gas can be used as gas to be contained in the LIF cell 186. In this connection, it should be added that in a case where other type of excimer laser device having a wavelength of 351 nm, 337 nm, 308 nm, 222 nm, 193 nm, 157 nm or the like is utilized, it suffices that material having a characteristic absorption wavelength at the aforementioned wavelength is selected.

Figure 23:
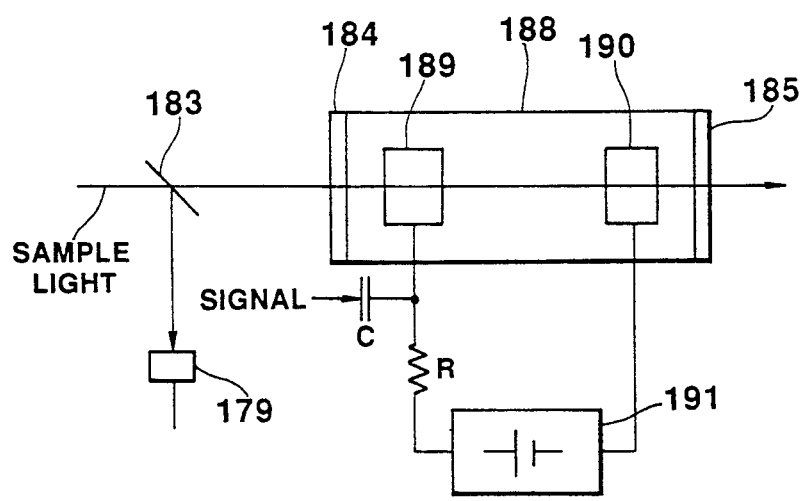

FIG. 23 is an explanatory view which schematically illustrates by way of example another structure of the monitor power/predetermined wavelength component power detector 17. A hollow cathode lamp is utilized for this modified example. As shown in FIG. 23, the hollow cathode lamp 188 includes an anode 189 and a cathode 190 and gas having a characteristic absorption wavelength at a required set center wavelength is contained in the hollow cathode lamp 188. If a wavelength of the sample light which has been introduced into the hollow cathode lamp 188 via a beam splitter 183 and a window 184 does not coincide with the characteristic absorption wavelength, gas atoms and molecules in the hollow cathode lamp 188 are not optically ionized. For the reason, a discharge current to flow via a direct current electricity supply source 191, a resistor R and the anode 189 and the cathode 190 does not vary.

However, if the wavelength of the sample light coincides with the characteristic absorption wavelength of gas atoms and molecules contained in the hollow cathode lamp 188, gas atoms and molecules in the hollow cathode lamp 188 are optically ionized so that a quantity of the discharge electric current varies. Thus, the center wavelength power can be detected by detecting a quantity of this variation via a condenser C. It should be noted that the monitor power can be detected by a first light intensity detector 179 (in accordance with a LOG method).

In the case of a KrF narrow operative range oscillation type excimer laser device capable of performing a tuning operation (a selecting operation for oscillation wavelength) at a wavelength of about 248.35±0.2 nm, a Hg type hollow cathode lamp or a Fe type hollow cathode lamp may be substituted for the hollow cathode lamp 188. When wavelength control is carried out by utilizing an atomic or molecular characteristic absorptive ray in the aforementioned manner, an oscillation wavelength can be immovably set to a required absolute wavelength with high accuracy for a long period of time, whereby an optimum excimer laser device employable as a light source for projecting and exposing figures in a reduced size can be provided.

Figure 24:
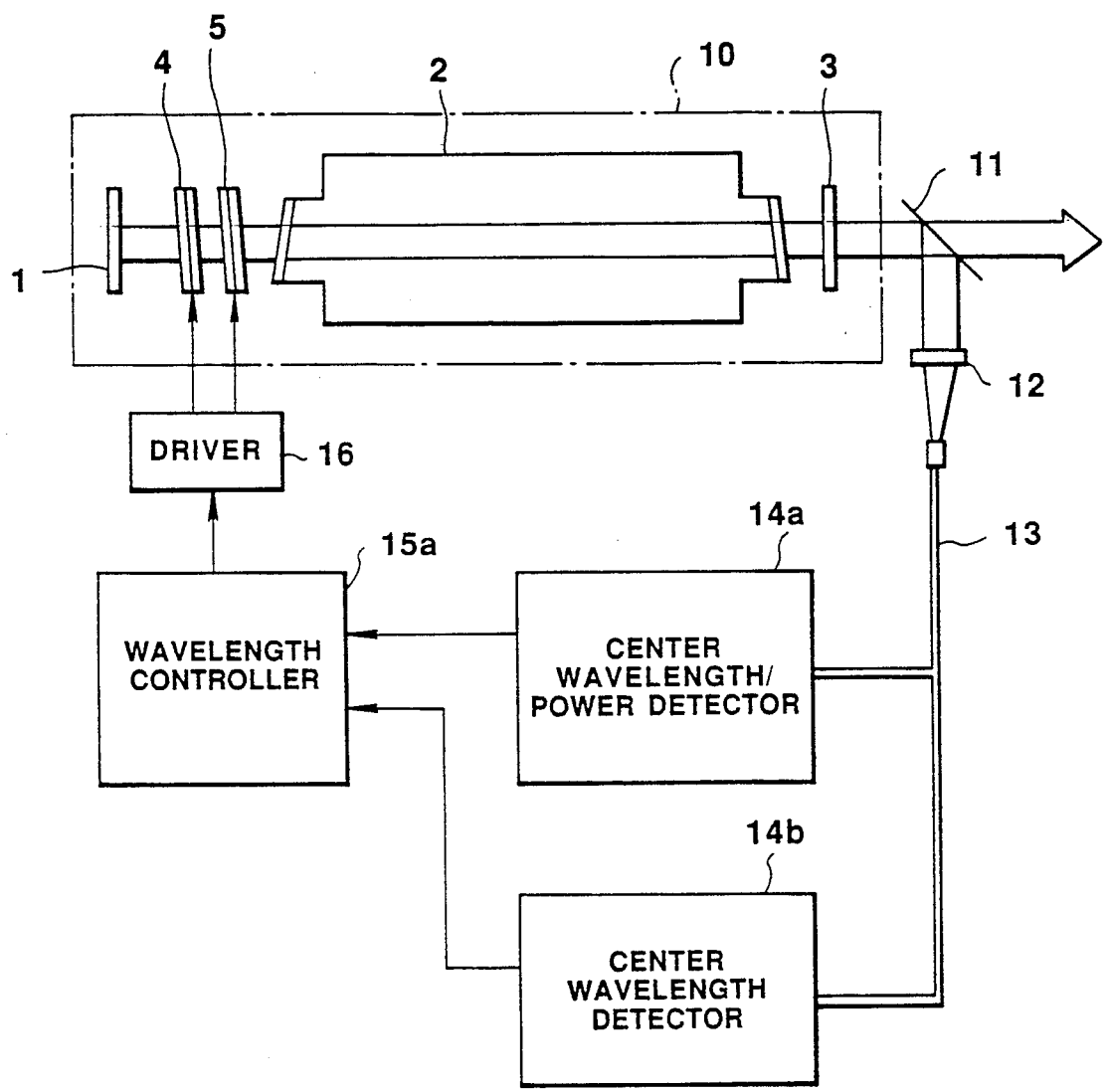
FIG. 24 is a block diagram which schematically illustrates an apparatus for controlling an output from an excimer laser device in accordance with another embodiment of the present invention, particularly illustrating a wavelength control system therefor.

FIG. 24 is a block diagram which schematically illustrates an apparatus for controlling an output from an excimer laser device in accordance with another embodiment of the present invention. According to this embodiment, the apparatus includes an oscillation center wavelength/center wavelength power detector 14a for which a diffraction grating type spectroscope is used to detect a large quantity of variation of a center wavelength and center wavelength power and an oscillation center wavelength detector 14b for which a monitor etalon is used to detect a very small quantity of variation of the center wavelength. It is generally known that the monitor etalon can largely increase a resolution and thereby it is very suitable for detecting a very small quantity of variation of the center wavelength. However, to raise up the resolution of the monitor etalon, there is a need of reducing its free spectrum range. Here, the resolution of the monitor etalon is represented by the following equation.

$$R \approx \frac{\lambda}{2\Delta\lambda} = \frac{2ndt}{\lambda} \quad (1)$$

(where n designates a refractive index of the medium existent between both mirror surfaces of etalons, d designates a distance between the both mirror surfaces of the etalons, t designates a finesse of each of the etalons designates λ designates a wavelength.) In addition, the free spectrum range FSR is represented by the following equation.

$$FSR = \frac{1}{2nd} \quad (2)$$

Therefore, when the resolution R of the monitor etalon is represented by using the free spectrum range FSR, it can be derived from the equations (1) and (2) in the form of an equation as noted below.

$$R = \frac{t}{FSR \cdot \lambda} \quad (3)$$

Since the finesse of each etalon can not be raised up in excess of a certain extent, there is a need of reducing the free spectrum range FSR in order to increase the resolution. However, when the wavelength which has be detected is shifted by the same wavelength as the free spectrum range FSR, the monitor etalon creates the substantially same fringe patterns as those before the wavelength is shifted. Accordingly, it is impossible to detect a large quantity of variation of the wavelength with the monitor etalon having a fine resolution. Particularly, with respect to a pulse laser device like the excimer laser device, there is a possibility that the controller can not detect the direction in which the wavelength is shifted, when the wavelength varies per each pulse. In view of the aforementioned fact, according to the embodiment of the present invention, the apparatus is provided with the oscillation center wavelength detector 14n for which the monitor etalon having a fine resolution is used to control the wavelength with a high accuracy and the oscillation center wavelength/center wavelength power detector 14a for which a diffraction grating type spectroscope is used to detect a large magnitude of variation of the center wavelength.

The oscillation center wavelength/center wavelength power detector 14a having a diffraction grating type spectroscope used therefor can be designed and fabricated in the same manner as that shown in FIG. 5, and the center wavelength λg and the center wavelength power Pλ detected by the oscillation center wavelength/center wavelength power detector 14a are inputted into a wavelength controller 15a.

The oscillation center wavelength detector 14b having a monitor etalon used therefor can be designed and fabricated in the same manner as that shown in FIG. 14, and the center wavelength λe detected by the oscillation center wavelength detector 14b with high accuracy is inputted also into the wavelength controller 15a.

The wavelength controller 15a controls a property of wavelength selection of the etalons 4 and 5 based on the values λg and λe which have been inputted into the wavelength controller 15a.

Figure 25:
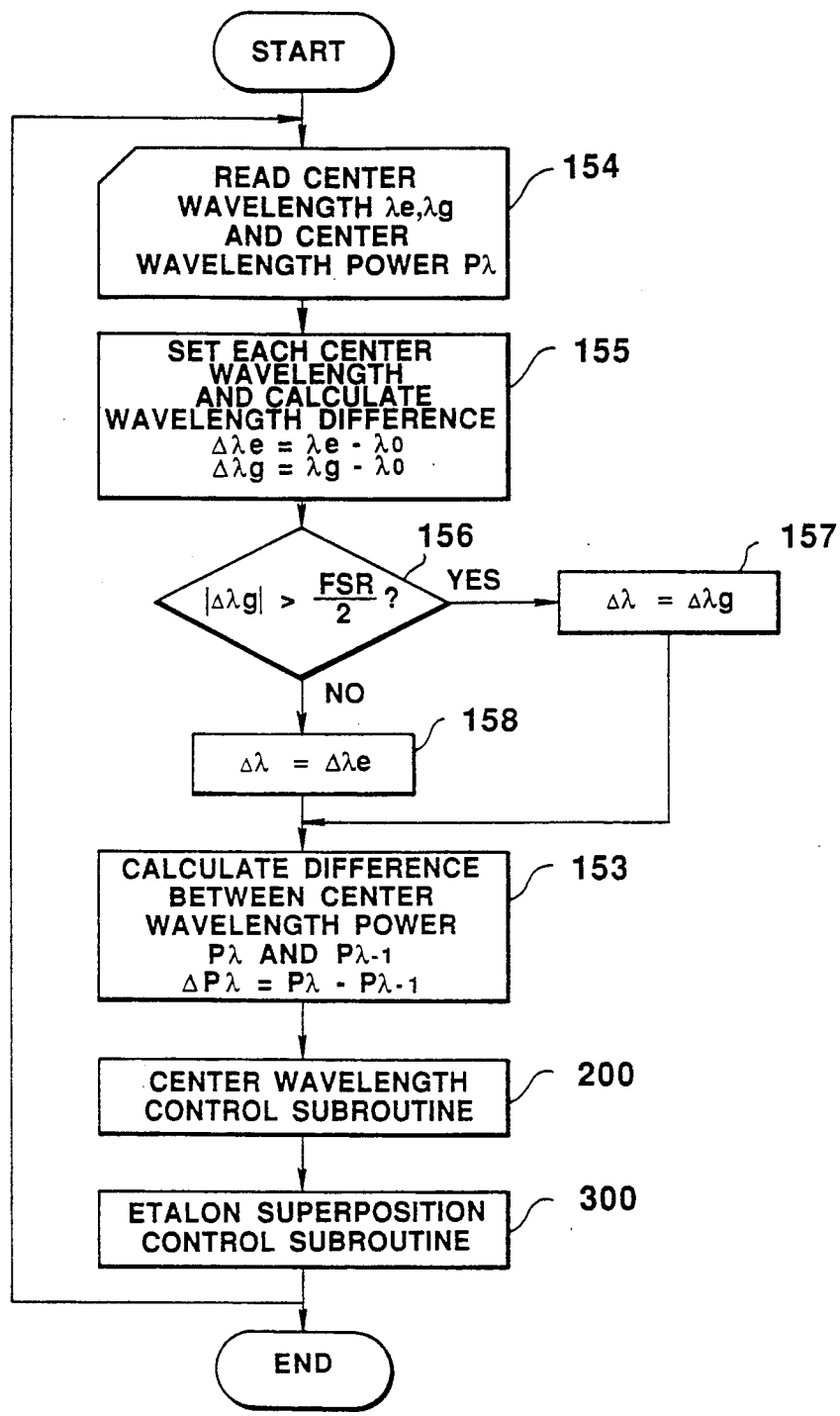
FIG. 25 is a flowchart which illustrates operations to be performed by the apparatus shown in FIG. 24.

FIG. 25 is a flowchart which concretely illustrates by way of example controlling operations to be performed by the wavelength controller 15a. First, at a step 154, the controller 15a reads the center wavelength and the center wavelength power which have been inputted from the oscillation center wavelength/center wavelength power detector 14a and moreover reads the center wavelength which have been inputted from the oscillation center wavelength detector 14b with high accuracy. According to this embodiment, the controller 15a samples a predetermined number of oscillated laser pulses and then averages them to calculate the center wavelength λg, the center wavelength power Pλ and the center wavelength λe for the same reasons as those at the step 151 in FIG. 8.

Next, the program goes to a step 155 at which the controller 15a executes a processing of calculating differences Δλg and Δλe between the λg and λe calculated at the step 154 and the set wavelength λ0, i.e., Δλg=λg−λ0 and Δλe=λe−λ0.

Subsequently, the program goes to a step 156 at which the controller 15a determines whether or not an absolute value |Δλg| indicative of a quantity of variation of the center wavelength detected by the oscillation center wavelength/center wavelength power detector 14a relative to the set wavelength is larger than ½ of the free spectrum range FSR derived from the monitor etalon of the oscillation center wavelength detector 14b (i.e., |Δλg|>FSR/2). If it is determined at the step 156 that |Δλg| is larger than FSR/2, the program goes sideward to a step 157 at which the controller 15a executes a processing of setting a quantity of variation of the center wavelength Δλ to the Δλg, i.e., Δλ=Δλg. If it is determined at the step 157 that |Δλg| is equal to or smaller than FSR/2, the program goes to a step 158 at which the controller 15a executes a processing of setting a quantity of variation of the center wavelength Δλ to the Δλe, i.e., Δλ=Δλe. Later steps are same as those shown in FIG. 8.

In this manner, according to the embodiment of the present invention, the apparatus is provided with the oscillation center wavelength/center wavelength power detector 14a having a diffraction grating type spectroscope used therefor and the oscillation center wavelength detector 14b having a monitor etalon used therefor so that the quantity of variation of the center wavelength Δλg detected by the oscillation center wavelength/center wavelength power detector 14a relative to the set wavelength and the quantity of variation of the center wavelength Δλe relative to the set wavelength are selectively shifted to each other based on the determination as to whether or not the absolute value |Δλg| indicative of the center wavelength detected by the oscillation center wavelength/center wavelength power detector 14a is larger than ½ of the free spectrum range FSR derived from the monitor etalon of the oscillation center wavelength detector 14b (i.e., |Δλg|>FSR/2).

It should be noted that an oscillation center wavelength/center wavelength power detector of the type having a monitor etalon used therefor of which free spectrum range is larger than that of the monitor etalon used for the oscillation center wavelength detector 14b may be substituted for the oscillation center wavelength/center wavelength power detector 14a for the apparatus in accordance with the embodiment of the present invention. With the apparatus of the present invention, the center wavelength power Pλ is detected by the oscillation center wavelength/center wavelength power detector 14a but it may be detected by the oscillation center wavelength detector having a monitor etalon 14b used therefor.

Figure 26:
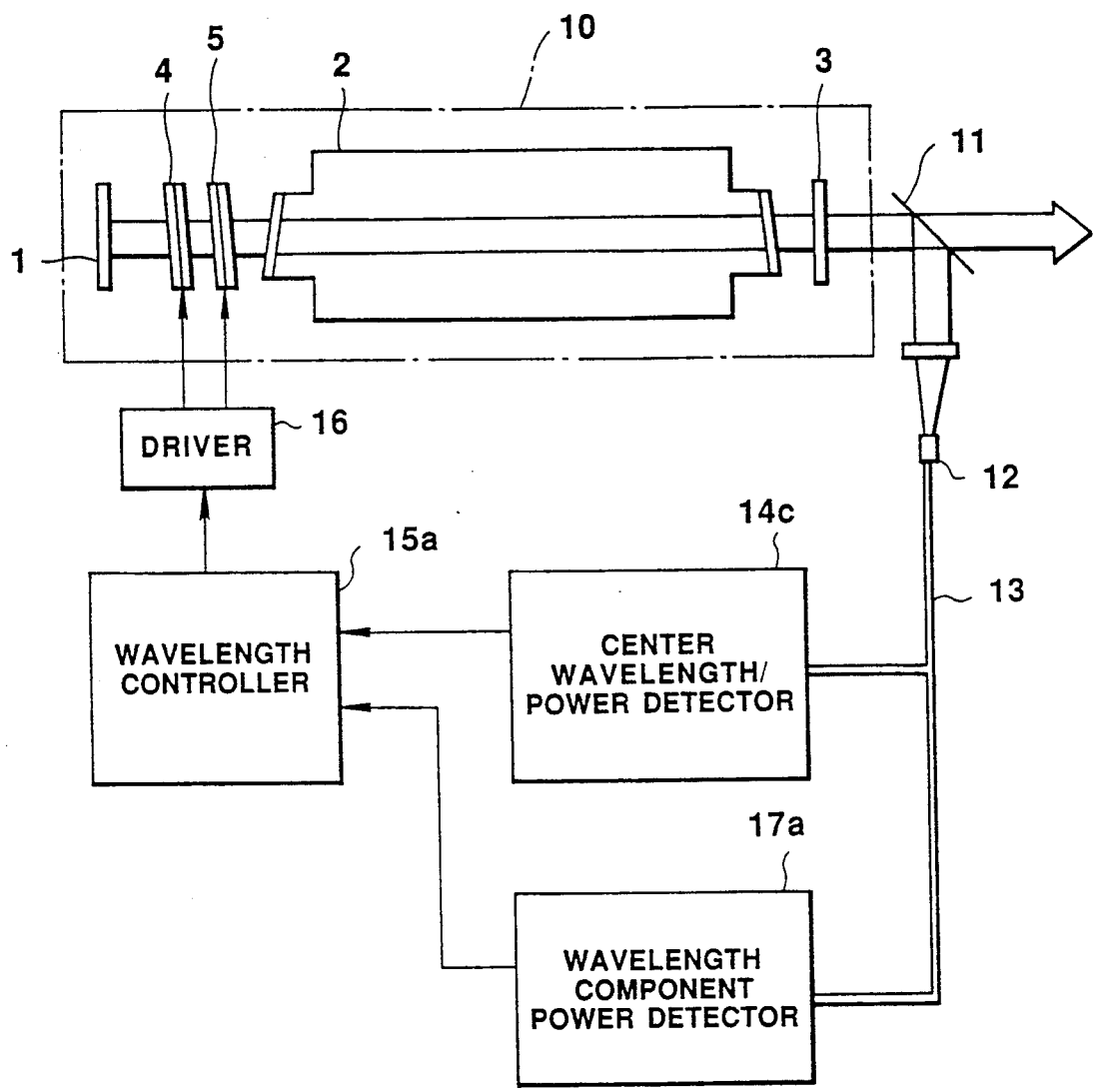
FIG. 26 is a block diagram which schematically illustrates an apparatus for controlling an output from an excimer laser device in accordance with another embodiment of the present invention, particularly illustrating a wavelength control system therefor.

FIG. 26 is a block diagram which schematically illustrates an apparatus for controlling an output from an excimer laser device in accordance with further another embodiment of the present invention. According to this embodiment, the apparatus includes an oscillation center wavelength/center wavelength power detector 14c having a diffraction grating type spectroscope used therefor as shown in FIG. 5 and a predetermined wavelength component power detector 17a having a monitor etalon used therefor as shown in FIG. 20.

Figure 27:
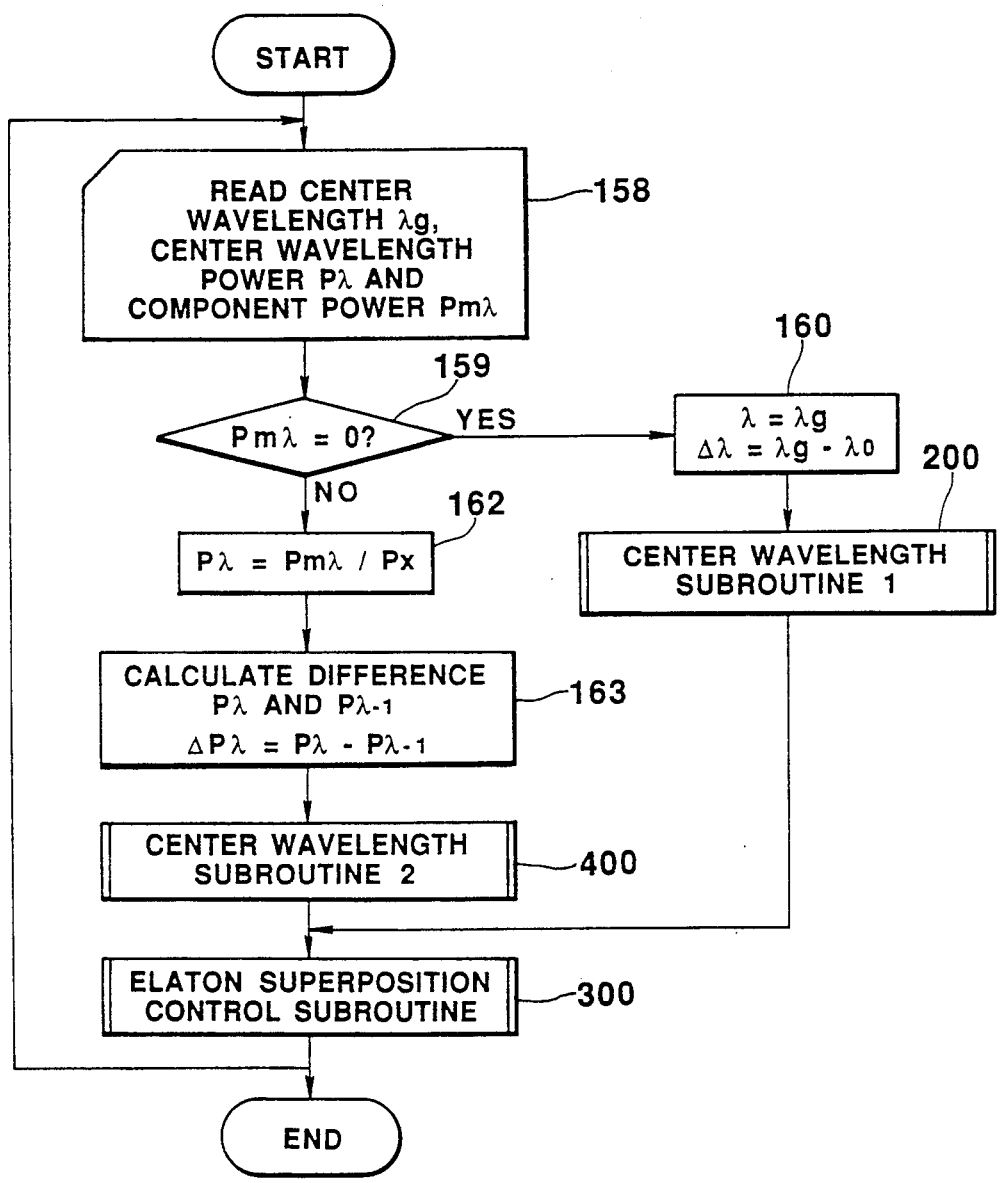
FIG. 27 is a flowchart which illustrates operations to be performed by the apparatus shown in FIG. 26.

FIG. 27 is a flowchart which concretely illustrates controlling operations to be performed by a wavelength controller 15b in accordance with this embodiment. First, at a step 158, the controller 15b reads the center wavelength $λ_g$ and the center wavelength power P which have been inputted from an oscillation center wavelength/center wavelength power detector 14c having a diffraction grating type spectrometer used therefor and moreover reads the center wavelength power P which has been inputted from a predetermined wavelength component power detector 17a having a monitor etalon used therefor. At the step 158, the controller 15b samples a predetermined number of oscillated laser pulses and then averages them to calculate the center wavelength power P and the predetermined wavelength component power Pmλ for the same reasons as those at the step 151 in FIG. 8.

Next, the program goes to a step 159. At this step, the controller 15b determines whether the predetermined wavelength component power detector 17a has detected the predetermined wavelength component power Pmλ or not, i.e., Pmλ is equal to zero or not. If it is determined at the step 159 that the Pmλ is equal to zero, the program goes sideward to a step 160 at which the controller 15b executes a processing of setting the center wavelength λ to λg, i.e., λ=λg and calculates a difference Δλ between center wavelength λ and a set wavelength λ0 (Δλ=λg−λ0). Thereafter, the program goes to a center wavelength control subroutine 200. This center wavelength control subroutine 200 is identical to the center wavelength control subroutine 200 shown in FIG. 200.

If it is determined at the step 159 that Pmλ is not equal to zero, the program goes to a step 162 at which the controller 15b calculates a value Pλ derived from specifying of the predetermined wavelength component power Pmλ, by dividing the predetermined wavelength component power Pm by the center wavelength power P (Pλ=Pmλ/P).

Thereafter, the program goes to a step 163 at which the controller 15b calculates a difference ΔPλ between the value Pλ specified at the step 162 and the value Pλ−1 specified during the preceding sampling operation (ΔPλ=Pλ−(Pλ−1)).

Subsequently, the program goes to a center wavelength control subroutine 400. This center wavelength control subroutine 400 is identical to the center wavelength control subroutine 400 in FIG. 17.

On completion of the center wavelength control subroutine 200 or 400, the program goes to an etalon superposition control subroutine 300. This etalon superposition control subroutine 300 is identical to the etalon superposition control subroutine 300 shown in FIG. 8.

Also in this embodiment, an oscillation center wavelength/center wavelength power detector having a monitor etalon used therefor of which free spectrum range is larger than that of the monitor etalon used for the predetermined wavelength component power detector 17a adapted to detect fine variation of a wavelength may be substituted for the oscillation center wavelength/center wavelength power detector 14c.

Figure 29:
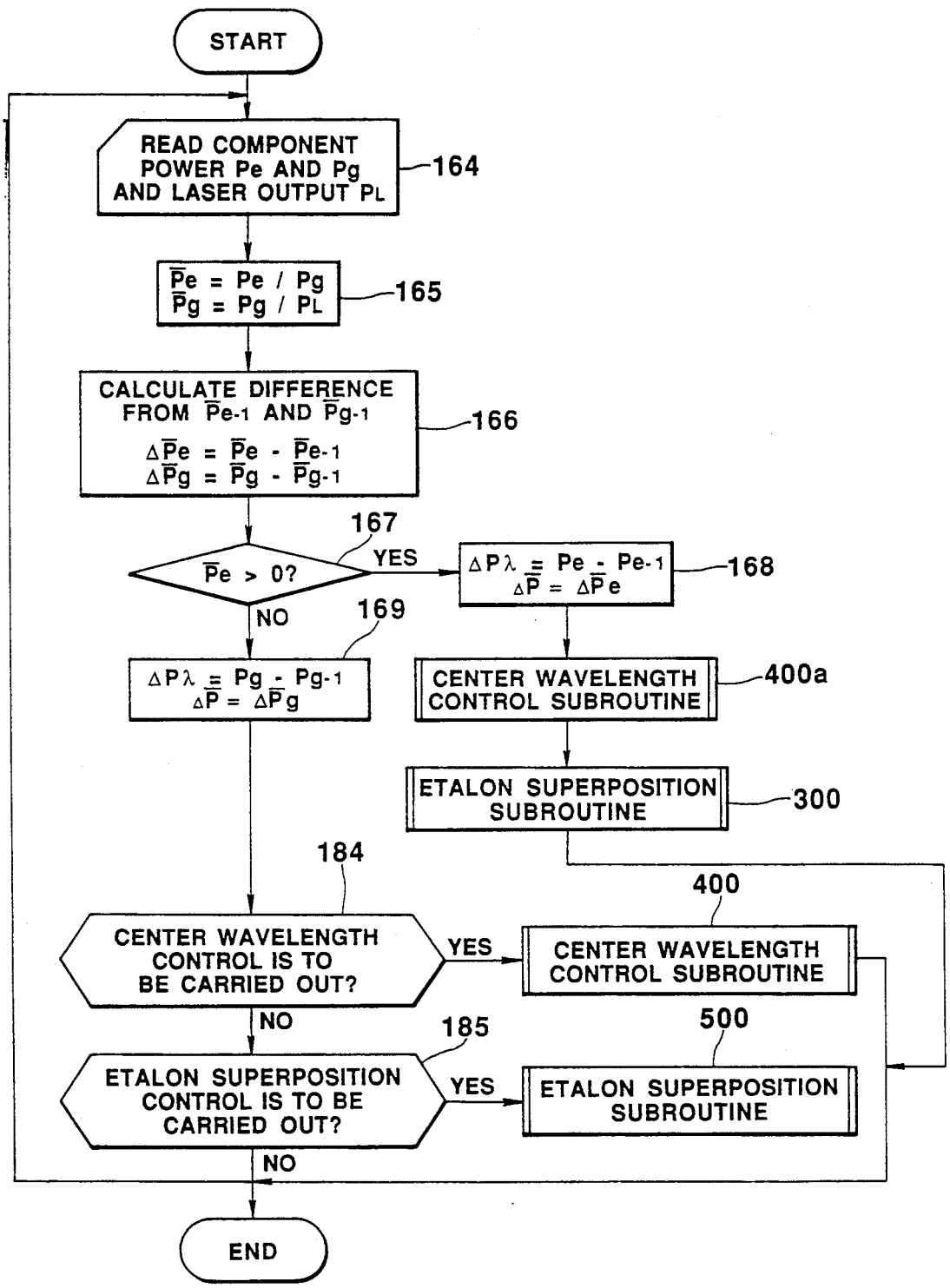
FIG. 29 is a flowchart which illustrates operations to be performed by the apparatus shown in FIG. 28.

In addition, a wavelength detector having an atomic or molecular characteristic absorption ray used therefor as shown in FIGS. 21 to 23 may be substituted for the predetermined wavelength component power detector having a monitor etalon used therefor to detect fine variation of a wavelength. A method employable in this case may be same as that as shown in FIG. 29. Such a wavelength detector assures that an oscillation wavelength can be immovably set to a required absolute wavelength with high accuracy for a long period of time.

Figure 28:
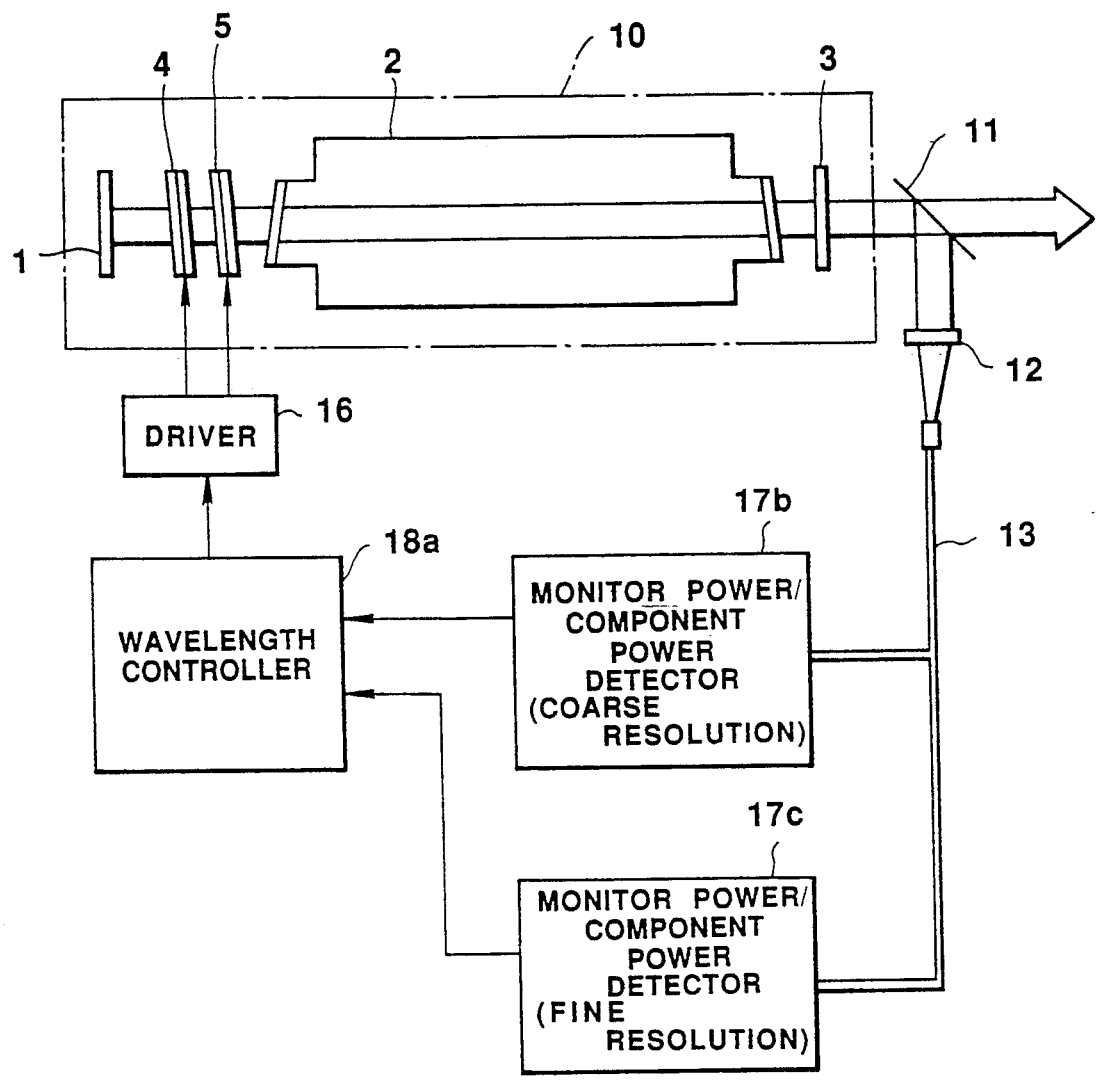
FIG. 28 is a block diagram which schematically illustrates an apparatus for controlling an output from an excimer laser in accordance with another embodiment of the present invention.

FIG. 28 is a block diagram which schematically illustrates an apparatus for controlling an output from an excimer laser device in accordance with further another embodiment of the present invention. According to this embodiment, the apparatus includes a monitor power/predetermined wavelength component power detector 17b having a diffraction grating type spectroscope used therefor as shown in FIG. 16 and a monitor power/predetermined wavelength component power detector 17c having a highly resolvable monitor etalon used therefor as shown in FIG. 20.

FIG. 29 is a flowchart which concretely illustrates by way of example controlling operations to be performed by a wavelength controller 18a for the apparatus in accordance with the embodiment of the present invention. In detail, first, at a step 164, the controller 18a reads the monitor power and the predetermined wavelength component power which have been inputted from the detector 17b and moreover reads the monitor power and center wavelength power which have been inputted from the monitor power/predetermined wavelength component power detector 17c. At this step, the controller 18a samples a predetermined number of oscillated laser pulses, average them and then calculates the monitor power PL, the predetermined wavelength component power $P_g$ detected by the predetermined wavelength component detector 17b having a diffraction grating type spectroscope used therefor and the predetermined center wavelength power $P_e$ detected by the the predetermined wavelength component detector 17c having a monitor etalon used therefor.

Next, the program goes to a step 165 at which the controller 18a executes a processing of specifying center wavelength power $\overline{P}_e$ and wavelength component $\overline{P}_g$ ($\overline{P}_e = P_e/P_g$, $\overline{P}_g = P_g/PL$).

Subsequently, the program goes to a step 166 at which the controller 18a executes a processing of calculating a difference $\Delta \overline{P}_e$ between the specified value $\overline{P}_e$ and the specified value $\overline{P}_{e-1}$ derived from the preceding reading operation and a difference a $\Delta \overline{P}_g$ between the specified value $\overline{P}_g$ and the specified value $\overline{P}_{g-1}$ ($\Delta \overline{P}_e = \overline{P}_e - \overline{P}_{e-1}$, $\Delta \overline{P}_g = \overline{P}_g - (\overline{P}_{g-1})$).

Subsequently, the program goes to a step 167 at which the controller 18a determines whether $P_e$ is more than zero or not. If it is determined at the step 167 that $P_e$ is more than zero, the program goes sideward to a step 188 at which the controller 18a executes a processing of equalizing $\Delta P$ to $\Delta P_e$. Thereafter, the controller 18a executes a center wavelength control subroutine 400a and an etalon superposition subroutine 400. It should be noted that the the center wavelength control subroutine 400 shown in FIG. 17 and the etalon superposition subroutine 300 is identical to the etalon superposition subroutine 300 shown in FIG. 8.

If it is determined at the step 167 that $P_e$ is not more than zero, the program goes to a step 169 at which the controller 18a executes a processing of equalizing $\Delta P\lambda$ to $P_g - (P_{g-1})$ and equalizing $\Delta P$ to $\Delta \overline{P}_e$. When the controller 18a determines later at a step 184 that it is to carry out center wavelength control, the program goes sideward to a center wavelength control subroutine 400, and thereafter when the controller 18a determines later at a step 185 that it is to carry out etalon superposition control, the program goes sideward to an etalon superposition subroutine 500. It should be added that the center wavelength control subroutine 400 and the etalon superposition subroutine 500 are identical to those shown in FIG. 14.

Figure 30:
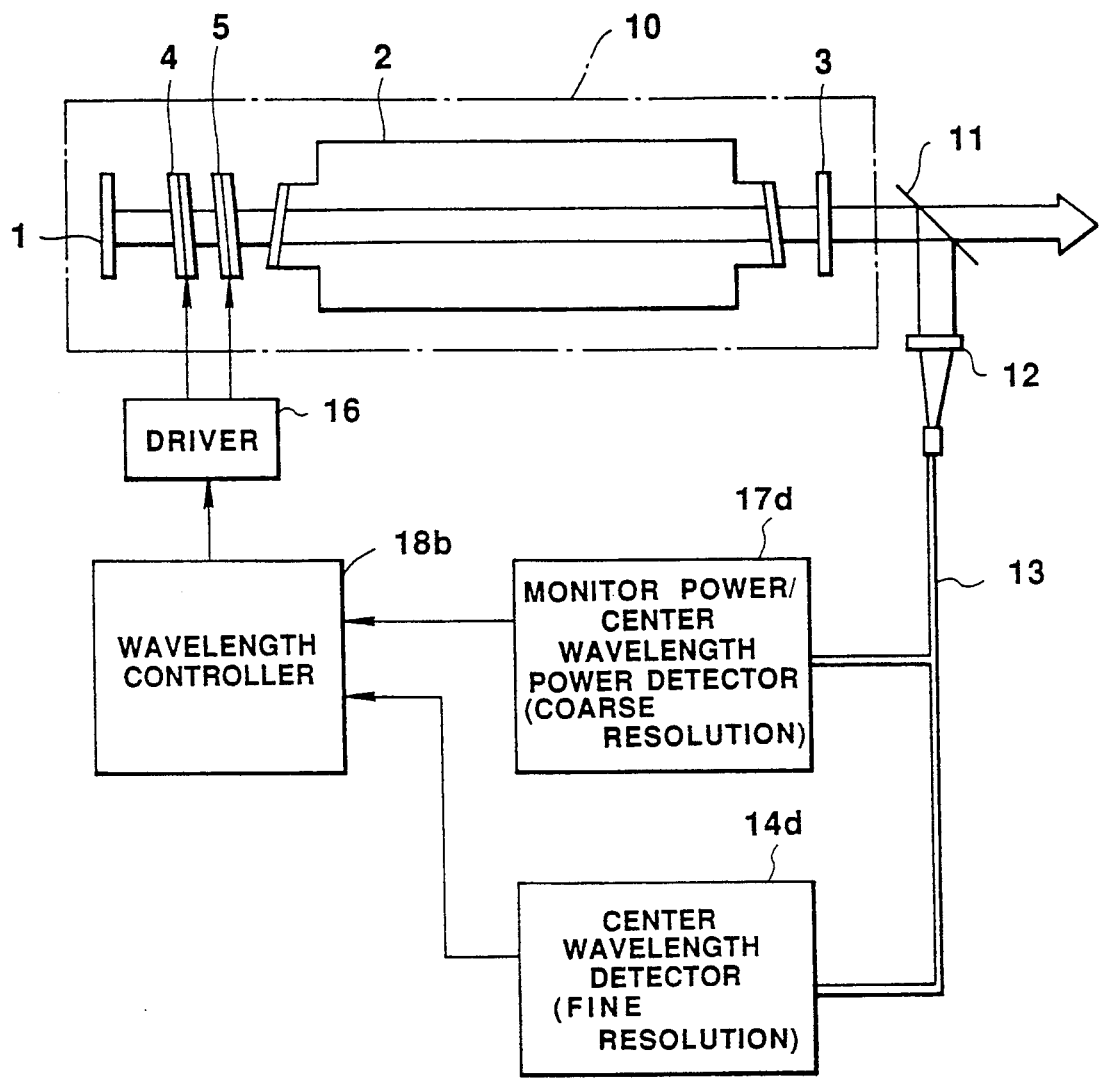
FIG. 30 is a block diagram which schematically illustrates an apparatus for controlling an output from an excimer laser in accordance with another embodiment of the present invention.

FIG. 30 is a block diagram which schematically illustrates an apparatus for controlling an output from an excimer laser device in accordance with further another embodiment of the present invention. According to this embodiment, the apparatus includes a monitor power/center wavelength power detector 17d having a diffraction grating type spectroscope used therefor as shown in FIG. 16 and an oscillation center wavelength detector 14d having a highly resolvable monitor etalon used therefor as shown in FIG. 14.

Figure 31:
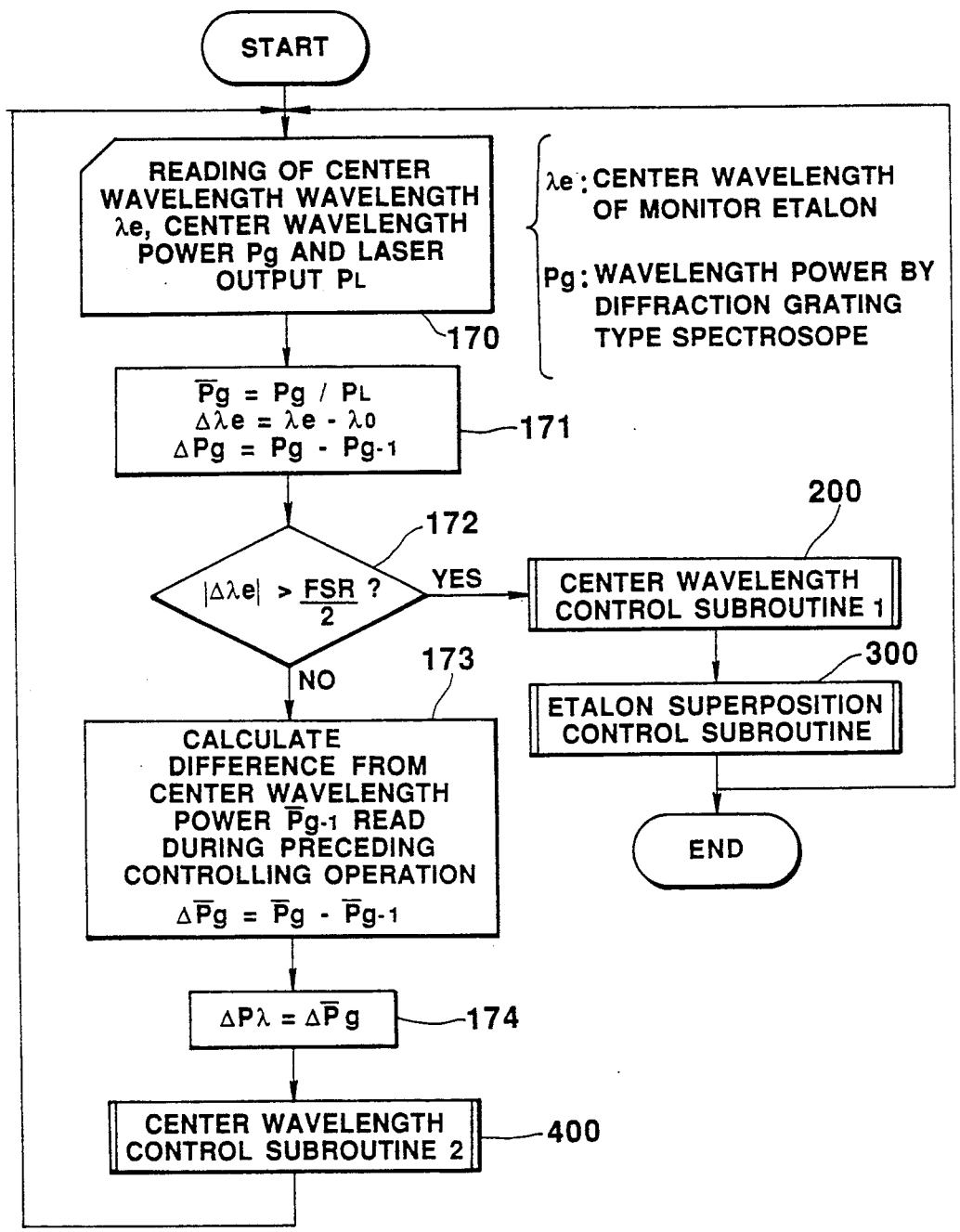
FIG. 31 is a flowchart which illustrates operations to be performed by the apparatus shown in FIG. 30.

FIG. 31 is a flowchart which concretely illustrates by way of example controlling operations to be performed by a wavelength controller 18b. First, at a step 170, the controller 18b reads the monitor power and the predetermined wavelength component power which have been inputted from the monitor power/predetermined wavelength power detector 17d and moreover reads the center wavelength which has been inputted from the oscillation center wavelength detector 14d. At the step 170, the controller 18a samples a predetermined number of oscillated laser pulses, averages them and calculates the monitor power PL detected by the monitor power/predetermined wavelength component power detector 17d and the center wavelength $\lambda_e$ detected by the oscillation center wavelength detector 14d for the same reasons at the step 151 shown in FIG. 8.

Next, the program goes to a step 171 at which the controller 18a executes a processing of specifying the predetermined wavelength component power $P_g$ detected by the monitor power/predetermined wavelength component power detector 17d (i.e., $\overline{P}_g = P_g/PL$) and then calculates a difference $\Delta \lambda_e$ between the center wavelength $\lambda_e$ detected by the oscillation center wavelength detector 14d and the set wavelength $\Delta \lambda_0$ ($\Delta \lambda_e = \lambda_e - \lambda_0$) as well as a difference $\Delta P_g$ between the predetermined wavelength component power $P_g$ and the predetermined wavelength component power $P_{g-1}$ sampled during the preceding controlling operation ($\Delta P_g = P_g - (P_{g-1})$).

Subsequently, at a step 172, the controller 18b determines whether an absolute value $|\Delta \lambda_e|$ indicative of the difference between the center wavelength $\lambda_e$ and the set wavelength $\lambda_0$ is larger than $\frac{1}{2}$ of the free spectrum range FSR of the monitor etalon for the oscillation center wavelength detector 14d ($|\Delta\lambda_e$FSR/2) or not. If it is determined at the step 172 that $|\Delta\lambda_e|$ is larger than FSR/2, the controller 18b executes a center wavelength control subroutine 200 and an etalon superposition subroutine 300. It should be noted that the center wavelength control subroutine 200 and the etalon superposition subroutine 300 are identical to those shown in FIG. 8.

If it is determined at the step 172 that $|\Delta\lambda_e|$ is not larger than FSR/2, the program goes to a step 173 at which the controller 18b carries out a processing of calculating the difference $\Delta\overline{P}_g$ between the value $\overline{P}_g$ specified at the step 171 and the value $\overline{P}_{g-1}$ specified during the preceding reading operation ($\Delta\overline{P}_g = \overline{P}_g - (\overline{P}_{g-1})$).

Subsequently, at a step 174, the controller 18b executes a processing of equalizing $\Delta P\lambda$ to $\Delta P_g$ and then the program goes to a center wavelength control subroutine 400. This center wavelength control subroutine 400 is identical to that shown in FIG. 17.

The present invention has been described above with respect to the embodiments shown in FIGS. 24 to 31 wherein a detector having a monitor etalon used therefor is used for the detector for detecting fine variation of center wavelength power in the proximity of the center wavelength and a detector having a diffraction grating type spectroscope used therefor or a detector having a monitor etalon used therefor of which free spectrum range is larger than that of the monitor etalon is used for the detector for detecting large variation of the center wavelength power in the proximity of the center wavelength. Alternatively, a detector having atomic or molecular absorption rays utilized therefor as shown in FIGS. 21, 22 and 23 may be used for the detector for detecting fine variation of the center wavelength power in the proximity of the center wavelength.

Figure 32:
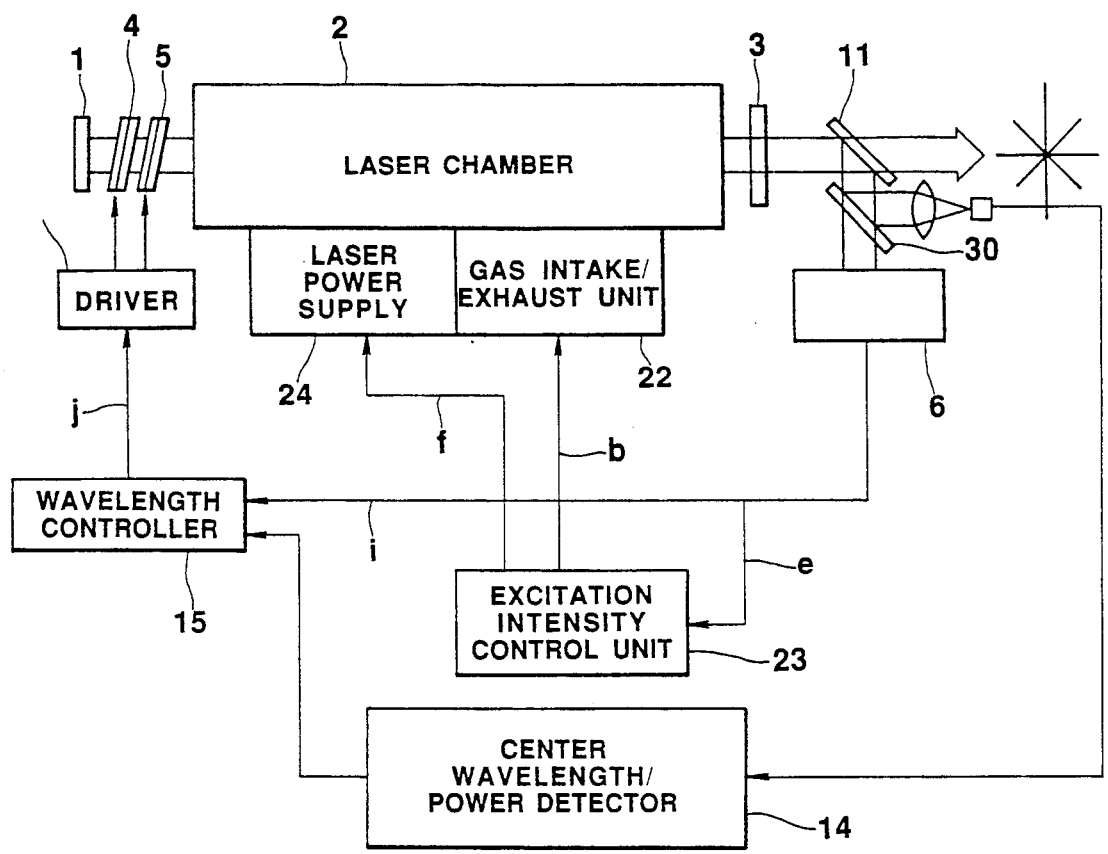
FIG. 32 is a block diagram which schematically illustrates an apparatus for controlling an output from an excimer laser in accordance with further another embodiment of the present invention.

FIG. 32 is a block diagram which schematically illustrates an apparatus for controlling an output from an excimer laser device in accordance with further another embodiment of the present invention. According to this embodiment, the CPU further includes an excitation intensity control unit 23 and a wavelength controller 15.

Figure 35:
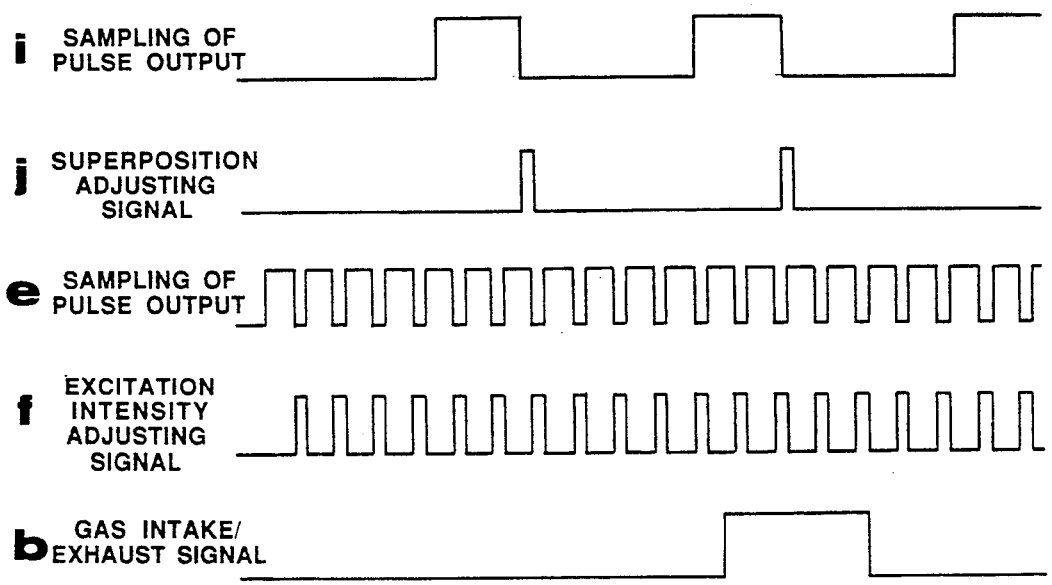
FIG. 35 shows a plurality of time charts which illustrate operations to be performed by an apparatus for controlling an output from an excimer laser device in accordance with further another embodiment of the present invention, respectively.

FIG. 35 shows a plurality of time charts which illustrate operations to be performed by the apparatus shown in FIG. 32. The apparatus always carries out superposition control as well as excitation intensity control. Further, to assure that the both controls do not compete or interfere with each other, the apparatus differs the number of sampling pulses for sampling each pulsed output during the superposition control from the number of sampling pulses for sampling each pulsed output during the excitation intensity control. When the excitation intensity control unit 23 determines that partial gas replacement is required and then the partial gas replacement is started in response to the gas intake/exhaust signal b transmitted to a gas intake/exhaust unit 22, the CPU enters a partial gas replacement mode in the same manner as the embodiment shown in FIG. 1, whereby an interval time of the excitation intensity control is shortened by reducing the number of sampling pulses and an intensity of excitation is frequently regulated. The partial gas replacement mode continues for a short period of time after the gas intake/exhaust signal b is turned off and thereby the partial gas replacement is completed, and it is ended when variation of laser light power disappears.

Figure 33:
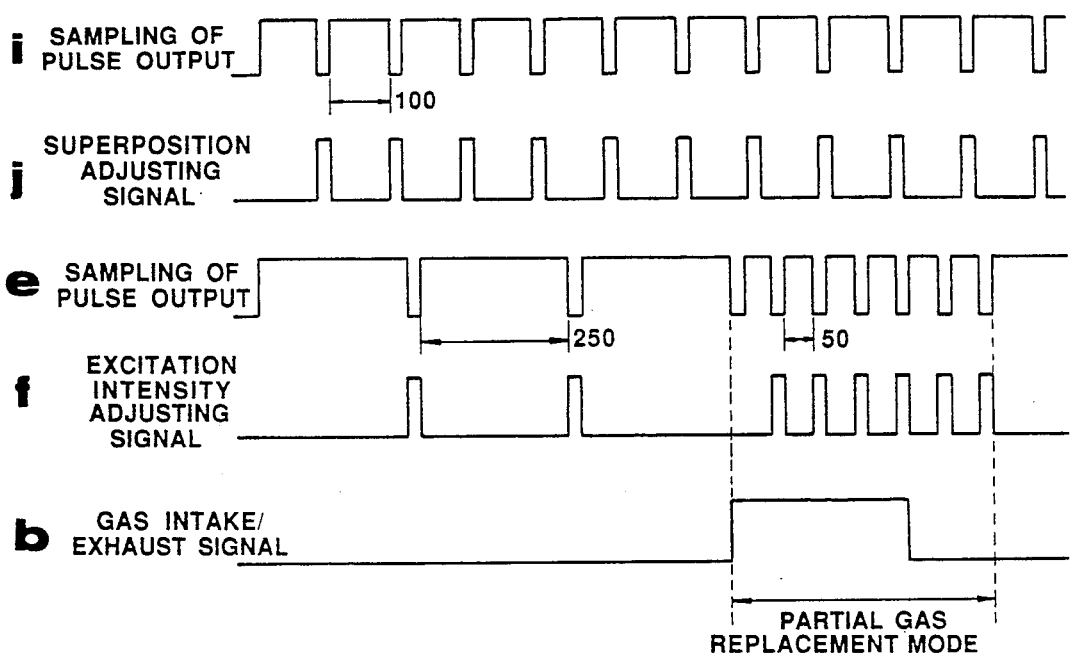
FIG. 33 shows a plurality of time charts which illustrate operations to be performed by the apparatus shown in FIG. 32, respectively.

According to a modified embodiment of the present invention shown in FIG. 33, the number of sampling pulses during each pulsed output sampling operation for the superposition control is set to 100 pulses, the number of sampling pulses during each pulsed output sampling operation for the excitation intensity control is set to 250 pulses and moreover the number of sampling pulses during each pulsed output sampling operation for the excitation intensity control in the partial gas replacement mode is set to 50 pulses. However, provided that no competition or interference takes place between the both controls and stable laser light power is obtainable, any number of pulses during each sampling operation is acceptable. As required, the number of sampling pulses may be changed sequentially.

Figure 34:
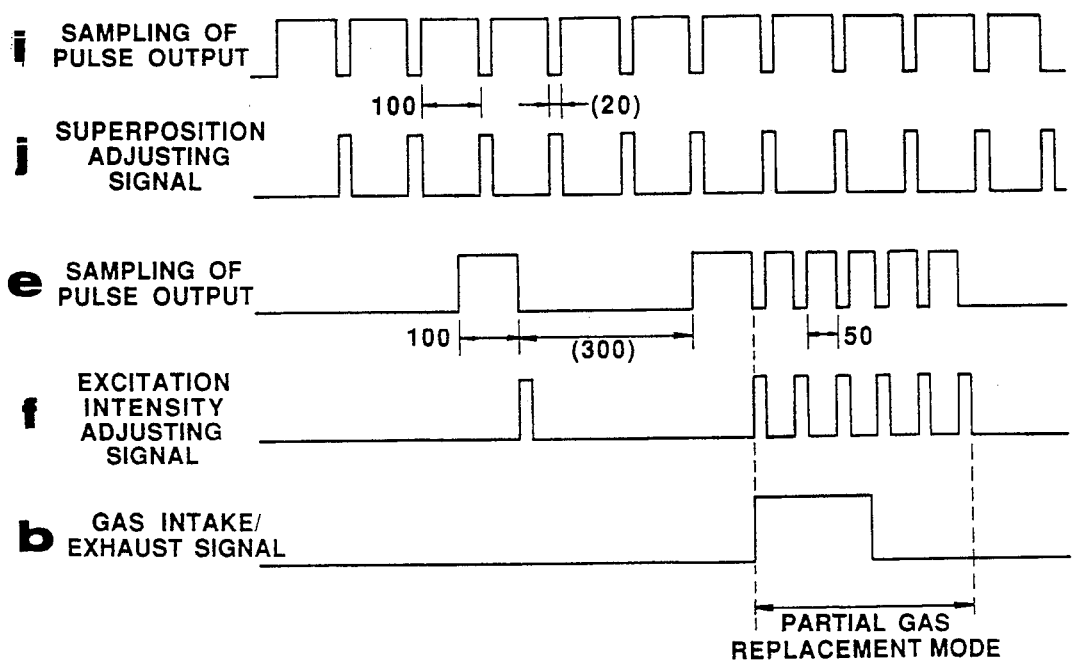
FIG. 34 shows a plurality of time charts which illustrate operations to be performed by an apparatus for controlling an output from an excimer laser device in accordance with further another embodiment of the present invention, respectively.

FIG. 34 shows a plurality of time charts which illustrate operations to be performed by the apparatus in accordance with other modified embodiment of the present invention. According to this embodiment, the number of sampling pulses during each pulsed output sampling operation for the superposition control is equalized to the number of sampling pulses during each pulsed output sampling operation for the excitation intensity control but an interval of each pulsed output sampling operation for the superposition control is different from an interval of each pulsed output sampling operation for the excitation intensity control.

Specifically, since an interval for practicing the excitation intensity control is determined sufficiently longer than an interval for practicing the superposition control and the laser medium is very few deteriorated with an oscillation in the range of 100 to 1000 pulses, it may be determined that variation of laser light power during the superposition control is induced by the superposition control itself. Consequently, the superposition control unit makes it possible to maintain the superposed state of wavelength selection elements in an optimum manner. Further, the control unit makes it possible to prevent competition or interference from taking place between the both controls.

According to the modified embodiment shown in FIG. 35, even when superposition control is intermittently carried out and excitation intensity control is continuously carried out, the apparatus of the present invention assures that stable laser power is obtained. In this case, it is not required that a partial gas exchange mode is set as shown in FIG. 1, FIG. 32 and FIG. 34.

Incidentally, functions and advantageous effects derived from the partial gas exchange mode in accordance with the modified embodiment shown in FIG. 34 are identical to those derived from the embodiment shown in FIG. 32.

Further, according to the modified embodiment shown in FIG. 34, an interval of sampling pulsed output is controlled by the number of pulses. Alternatively, the interval may be controlled in the fashion of time control. If desired, the number of interval pulses or the interval time may be changed sequentially.

As will be readily apparent from the above description, according to any one of the above-described embodiments, a factor of inducing variation of laser power can be recognized reliably. Thus, the laser power can be monitored without an occurrence of confusion or interference between two controls in such a manner that operations of a control system adapted to carry out superposition control are performed independently of operations of another control system adapted to carry out excitation intensity control. As a result, a wavelength and laser power can be controlled with stability.

Finally, it should be added that the excitation intensity control may be carried out at the same time of the superposition control by utilizing variation of the laser power induced by the superposition control.

INDUSTRIAL APPLICABILITY

As described above, the apparatus of the present invention for controlling an output from an excimer laser device including at least two etalons arranged between a rear mirror and a laser chamber carries out output control under a condition that center wavelength control is combined with the superposition control. Consequently, with the apparatus, a stable center wavelength can be obtained and variation of laser power can be reduced remarkably. Thus, when the excimer laser device to which the present invention is applied is employed as a light supply source for an unit for projecting and exposing figures in a reduced size, a stable focus position, a large magnification and a fine resolution are obtainable. In addition, an exposing time can be maintained constant and a quantity of exposing light can be controlled with easiness.

Further, according to the present invention, a factor of inducing variation of the laser power can reliably be recognized without an occurrence of confusion or interference between the center wavelength control and the superposition control, whereby laser power and wavelength can be controlled stably. Therefore, when the apparatus is employed for an exposing unit, exposure can be accomplished with high accuracy.

We claim:

1. An apparatus for controlling an output from an excimer laser device wherein at least two etalons are arranged between a laser chamber for said excimer laser device and a rear mirror and a wavelength of output laser light is controlled by controlling a property of wavelength selection of each etalon, wherein said apparatus includes;
   wavelength detecting means for detecting said wavelength of said output laser light,
   power detecting means for detecting power at a center wavelength of the output laser light,
   first controlling means for controlling a property of wavelength selection of at least the etalon having a minimum free spectrum range among said etalons so as to allow a wavelength detected by said wavelength detecting means to coincide with a required specified wavelength, and
   second controlling means for controlling a property of wavelength selection of the other etalon(s) exclusive of said etalon having the minimum free spectrum range so as to allow power detected at said center wavelength by said power detecting means to be maximized.

2. An apparatus for controlling an output from an excimer laser device as claimed in claim 1, wherein control of a property of wavelength selection of each etalon is carried out in response of variation of at least one parameter selected from a plurality of parameters comprising a temperature of said etalon, an angle of the same, pressure at a gap portion and a distance across said gap portion.

3. An apparatus for controlling an output from an excimer laser device as claimed in claim 1, wherein the etalons arranged between the laser chamber and the rear mirror comprise a first etalon having a smaller free spectrum range and a second etalon having a larger free spectrum range,
   the first controlling means controls a property of wavelength selection of at least said first etalon, and
   the second controlling means controls a property of wavelength property of said second etalon.

4. An apparatus for controlling an output from an excimer laser device as claimed in claim 1, wherein the etalons arranged between the laser chamber and the rear mirror comprise three or more etalons,
   the first controlling means controls at least the etalon having a minimum free spectrum range among said three or more etalons, and
   the second controlling means successively controls a property of wavelength selection of each of the other etalons exclusive the etalon having the minimum free spectrum range.

5. An apparatus for controlling an output from an excimer laser device as claimed in claim 1, wherein the first controlling means includes;
   means for calculating a difference between the wavelength detected by the wavelength detecting means and the specific wavelength and
   means for shifting a transmission center wavelength of each etalon by a value calculated by said calculating means.

6. An apparatus for controlling an output from an excimer laser device as claimed in claim 1, wherein the second controlling means includes;
   means for calculating a difference between the output from the power detecting means sampled during the preceding controlling operation and the output of the power detecting means sampled during the present controlling operation,
   means for determining the direction of shifting of a wavelength for increasing power, based on the code of the value calculated by said calculating means and the direction of shifting of said wavelength during the preceding sampling operation, and
   means for shifting a transmission center wavelength of each etalon in the direction of shifting of the wavelength determined by said determining means.

7. An apparatus for controlling an output from an excimer laser device as claimed in claim 1, wherein the wavelength detecting means includes;
   a diffraction grating type spectroscope having a diffraction grating of which turning angle is fixedly set to a required angle and
   a light position sensor for detecting the position of a diffracted image of an incident slit of said diffraction grating type spectroscope.

8. An apparatus for controlling an output from an excimer laser device as claimed in claim 1, wherein the power detecting means includes;
   a diffraction grating type spectroscope having a diffraction grating of which turning angle is fixedly set to a required angle and
   light detecting means for detecting a light intensity of the diffracted image of an incident slit of said diffraction grating type spectroscope.

9. An apparatus for controlling an output from an excimer laser device as claimed in claim 1, wherein the wavelength detecting means includes;
   a monitor etalon and a light position sensor for detecting positions where a plurality of fringe patterns are built by said monitor etalon.

10. An apparatus for controlling an output from an excimer laser device as claimed in claim 1, wherein the power detecting means includes;
a monitor etalon and
light detecting means for detecting an intensity of light from a plurality of fringe patterns which are built by said etalon.

11. An apparatus for controlling an output from an excimer laser device wherein at least two etalons are arranged between a laser chamber for said excimer laser device and a rear mirror and a wavelength of output laser light is controlled by controlling a property of wavelength selection of each of said etalons, wherein said apparatus includes;
first power detecting means for detecting output power from the excimer laser device,
second power detecting means for detecting power of a predetermined wavelength component in said output laser light,
specifying means for specifying an output from said second power detecting means based on an output from said first power detecting means,
first controlling means for controlling a property of wavelength selection of at least the etalon having a minimum free spectrum range among said etalons so as to allow the power specified by said specifying means to be maximized, and
second controlling means for controlling a property of wavelength selection of the other etalon(s) exclusive the etalon having the minimum free spectrum range so as to allow the second power of the second power detecting means for detecting said predetermined wavelength component power to be maximized.

12. An apparatus for controlling an output from an excimer laser device as claimed in claim 11, wherein the first controlling means includes;
means for calculating a difference between the output from the specifying means sampled during the preceding controlling operation and the output from the specifying means sampled during the present controlling operation,
means for determining the direction of shifting of a wavelength for increasing power, based on the code of the value calculated by said calculating means and the direction of shifting of a wavelength during the preceding sampling operation, and
means for shifting a transmission center wavelength of each etalon in the direction of shifting of the etalon which is determined by said determining means.

13. An apparatus for controlling an output from an excimer laser device as claimed in claim 11, wherein the second controlling means;
means for calculating a difference between the second power sampled during the preceding controlling operation and the second power sampled during the present controlling operation,
means for determining the direction of shifting of a wavelength for increasing power, based on the code of the value calculated by said calculating means and the direction of shifting of a wavelength during the preceding sampling operation, and
means for shifting the transmission center wavelength of each etalon in the direction of shifting of the wavelength which is determined by said determining means.

14. An apparatus for controlling an output from an excimer laser device as claimed in claim 11, wherein the first power detecting means includes a light detecting element for detecting an intensity of laser light to be inputted into the second power detecting means.

15. An apparatus for controlling an output from an excimer laser device as claimed in claim 11, wherein the second power detecting means includes a light detecting element for detecting an intensity of laser light transmitting through an incident slit which is disposed in a diffraction grating type spectroscope having a diffraction grating of which turning angle is fixedly set to a required angle.

16. An apparatus for controlling an output from an excimer laser device as claimed in claim 11, wherein the second power detecting means includes a monitor etalon and light detecting means for detecting an intensity of laser light transmitting through a slit which is disposed for detecting an intensity of light from a plurality of fringe patterns which are built by said monitor etalon.

17. An apparatus for controlling an output from an excimer laser device as claimed in claim 11, wherein the second power detecting means includes;
a cell in which gas adapted to absorb light having a specific wavelength is contained and
a light detecting element for detecting an intensity of light transmitting through said cell.

18. An apparatus for controlling an output from an excimer laser device as claimed in claim 11, wherein the second power detecting means includes;
a cell in which gas adapted to generate fluorescent light by absorbing light having a specific wavelength is contained and
a detecting element for detecting said fluorescent light which is generated by said cell.

19. An apparatus for controlling an output from an excimer laser device as claimed in claim 11, wherein the second power detecting means includes;
a cell in which gas adapted to absorb light having a required wavelength and an electrode having a predetermined voltage applied thereto are contained and
electric current detecting means for detecting variation of an electric current flowing through said electrode.

20. An apparatus for controlling an output from an excimer laser device wherein at least two etalons are arranged between a laser chamber for said excimer laser device and a rear mirror and a wavelength of output laser light is controlled by controlling a property of wavelength selection of each of said etalons, wherein said apparatus includes;
first wavelength detecting means having a highly resolvable monitor etalon used therefor for detecting fine variation of a center wavelength of output laser light,
second wavelength detecting means having a lower resolution than that of said monitor etalon for detecting large variation of a center wavelength of output laser light,
selecting means for selecting the wavelength detected by said second wavelength detecting means, when an absolute value indicative of a difference between the wavelength detected by said second wavelength detecting means and a set wavelength is larger than ½ of a free spectrum range of the monitor etalon for said first wavelength detecting means, and selecting the wavelength detected by said first wavelength detecting means, when the former is smaller than the latter, and first controlling means for controlling a property of wavelength selection of at least the etalon having a minimum free spectrum range among said etalons so as to allow the wavelength selected by said selecting means to coincide with a required specific wavelength, and second controlling means for controlling a property of wavelength selection of the other etalon(s) exclusive the etalon having the minimum free spectrum so as to allow the power detected by power detecting means for said center wavelength to be maximized.

21. An apparatus for controlling an output from an excimer laser device as claimed in claim 20, wherein the second wavelength detecting means includes a diffraction grating type spectroscope used therefor.

22. An apparatus for controlling an output from an excimer laser device as claimed in claim 20, wherein the second wavelength detecting means includes a monitor etalon used therefor, said monitor etalon having a free spectrum range larger than that of the first wavelength detecting means.

23. An apparatus for controlling an output from an excimer laser device wherein at least two etalons are arranged between a laser chamber for said excimer laser device and a rear mirror and a wavelength of output laser light is controlled by controlling a property of wavelength selection of each etalon, wherein said apparatus includes;

first power detecting means for detecting power of said output laser light having a center wavelength, second power detecting means having a highly resolvable monitor etalon used therefor for detecting power of a predetermined wavelength component of the output laser light, and means for specifying an output from said second power detecting means based on an output from said first power detecting means, wavelength detecting means for detecting large variation of the center wavelength of the output laser light, said wavelength detecting means having a resolution lower than that of said monitor etalon, first controlling means for controlling a property of wavelength selection of at least the etalon having a minimum free spectrum range among said etalons so as to allow the wavelength detected by said wavelength detecting means to coincide with a required specific wavelength, when said first power detecting means does not detect said first power, second controlling means for controlling a property of wavelength selection of at least the etalon having a minimum free spectrum range among said etalons so as to allow the power specified by said specifying means to be maximized, when said first detecting means detects said first power, and third controlling means for controlling a property of wavelength selection of the other etalon(s) exclusive of the etalon having a minimum free spectrum range so as to allow the power detected by the first power detecting means for detecting power of the output laser light having a center wavelength to be maximized.

24. An apparatus for controlling an output from an excimer laser device as claimed in claim 23, wherein the second power detecting means includes;

a cell in which gas adapted to absorb light having a specific wavelength is contained and a light detecting element for detecting an intensity of light which transmits through said cell.

25. An apparatus for controlling an output from an excimer laser device as claimed in claim 23, wherein the second power detecting means includes;

a cell in which gas adapted to generate fluorescent light in response to absorption of light having a specific wavelength is contained and a detecting element for detecting the fluorescent light generated in said cell.

26. An apparatus for controlling an output of an excimer laser device as claimed in claim. 23, wherein the second power detecting means includes;

a cell in which gas adapted to absorb light having a specific wavelength and an electrode having a predetermined voltage applied thereto are contained and electric current detecting means for detecting variation of an electric current flowing through said electrode.

27. An apparatus for controlling an output from an excimer laser device wherein at least two etalons are arranged between a laser chamber for said excimer laser device and a rear mirror and a wavelength of output laser light is controlled by controlling a property of wavelength selection of each etalon, wherein said apparatus includes;

first power detecting means for detecting output power from the excimer laser device, second power detecting means having a highly resolvable monitor etalon used therefor for detecting power of a predetermined wavelength component of the output laser light, third detecting means for detecting power of a predetermined wavelength component of the output laser light, first specifying means for specifying the output from said second power detecting means based on the output from said first power detecting means, second specifying means for specifying the output from said third power detecting means based on the output from said first power detecting means, first controlling means for controlling a property of wavelength selection of at least the etalon having a minimum free spectrum range among said etalons so as to allow the power specified by said first specifying means to be maximized and moreover controlling a property of wavelength selection of the other etalon(s) exclusive of the etalon having a minimum free spectrum range so as to allow the power from said second power detecting means to be maximized, when an output from the said first specifying means is detected, and second controlling means for controlling a property of wavelength selection of at least the etalon having a minimum free spectrum range among said etalons so as to allow the power specified by said second specifying means to be maximized, when and output from said first specifying means is not detected.

28. An apparatus for controlling an output from an excimer laser device wherein at least two etalons are arranged between a laser chamber for said excimer laser device and a rear mirror and a wavelength of output laser light is controlled by controlling a property of wavelength selection of each etalon, wherein said apparatus includes;

wavelength detecting means having a highly resolvable monitor etalon used therefor for detecting a center wavelength of said output laser light, first power detecting means for detecting output power from the excimer laser device, second detecting means for detecting power of a predetermined wavelength component of said output laser light, specifying means for specifying an output from said first power detecting means based on an output from said first power detecting means, first controlling means for controlling a property of wavelength selection of at least the etalon having a minimum free spectrum range among said etalons so as to allow the wavelength detected by said specifying means to coincide with a required set wavelength, when an absolute value indicative of a difference between the wavelength detected by said wavelength detecting means and a set wavelength is smaller than $\frac{1}{2}$ of the free spectrum range of a monitor etalon of said wavelength detecting means, and moreover controlling a property of wavelength selection of the other etalon(s) exclusive of the etalon having a minimum free spectrum range so as to allow the power detected by said second power detecting means to be maximized, and second controlling means for controlling a property of wavelength selection of at least the etalon having a minimum free spectrum range among said etalons so as to allow the power specified by said specifying means to be maximized, when the absolute value indicative of the difference between the wavelength detected by the wavelength detecting means and a set wavelength is larger than $\frac{1}{2}$ of the free spectrum range of said monitor etalon of the wavelength detecting means.

29. An apparatus for controlling an output of an excimer laser device wherein at least two wavelength selecting elements are arranged in a resonator of a laser oscillator so that a wavelength of laser light is narrowed by superposition control for superposing properties of wavelength selection of said wavelength selecting elements each other and power of said laser light is variably controlled by excitation intensity control for controlling an intensity of excitation of a laser medium, wherein said apparatus includes;

controlling means for executing said superposition control and said excitation intensity control in a different timing relationship therebetween so as to eliminate the mutual influence caused by the superposition control and the excitation intensity control.

30. An apparatus for controlling an output of an excimer laser device as claimed in claim 29, wherein the number of pulses during a sampling operation performed in response to pulsed laser output to execute the superposition control is different from the number of pulses during a sampling operation performed in response to pulsed laser output to execute the excitation intensity control.

31. An apparatus for controlling an output from an excimer laser device as claimed in claim 29, wherein an interval during each sampling operation performed in response to pulsed laser output to execute the superposition control is different from an interval during each sampling operation performed in response to pulsed laser output to execute the excitation intensity control.

32. An apparatus for controlling an output from an excimer laser device as claimed in claim 29, wherein at least one of the superposition control and the excitation intensity control is executed intermittently.

33. An apparatus for controlling an output from an excimer laser device as claimed in claim 29, wherein the superposition control and the excitation intensity control are alternately executed or one of the superposition control and the excitation intensity control is intermittently executed with a properly determined time distance from the other one.

* * * * *